(12) United States Patent
Andreani et al.

(10) Patent No.: US 9,755,627 B2
(45) Date of Patent: Sep. 5, 2017

(54) SERIES-RESONANCE OSCILLATOR

(71) Applicant: Telefonaktiebolaget L M Ericsson (publ), Stockholm (SE)

(72) Inventors: Pietro Andreani, Lund (SE); Luca Fanori, Pavia (IT); Thomas Mattsson, Limhamn (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 0 days.

(21) Appl. No.: 14/417,040

(22) PCT Filed: Apr. 17, 2014

(86) PCT No.: PCT/EP2014/057873
§ 371 (c)(1),
(2) Date: Jan. 23, 2015

(87) PCT Pub. No.: WO2015/158387
PCT Pub. Date: Oct. 22, 2015

(65) Prior Publication Data
US 2015/0381157 A1    Dec. 31, 2015

(51) Int. Cl.
*H03B 5/08* (2006.01)
*H03B 5/18* (2006.01)
(Continued)

(52) U.S. Cl.
CPC ............... *H03K 5/145* (2013.01); *H03B 5/12* (2013.01); *H03B 5/1228* (2013.01); *H03B 5/24* (2013.01);
(Continued)

(58) Field of Classification Search
CPC ......... H03K 5/145; H03K 2005/00286; H03K 3/0315; H03K 3/354; H03B 5/1228;
(Continued)

(56) References Cited

U.S. PATENT DOCUMENTS 6,690,243 B1    2/2004  Henrion
8,018,292 B2    9/2011  Wachi et al.
(Continued)

OTHER PUBLICATIONS

Duncan, Ralph et al., "A 1 GHz Quadrature Sinusoidal Oscillator," Proceedings of the IEEE 1995 Custom Integrated Circuits Conference, IEEE, May 1-4, 1995, pp. 91-94.
(Continued)

*Primary Examiner* — Richard Tan
(74) *Attorney, Agent, or Firm* — Withrow & Terranova, PLLC

(57) ABSTRACT

An oscillator circuit comprises a first tank circuit comprising an inductive element and a capacitive element coupled in series between a first voltage rail and a first drive node. A feedback stage is coupled to a first tank output of the first tank circuit and to the first drive node. The feedback stage is arranged to generate, responsive to a first oscillating tank voltage present at the first tank output, a first oscillating drive voltage at the first drive node in-phase with a first oscillating tank current flowing in the inductive element and the capacitive element, thereby causing the oscillator to oscillate in a series resonance mode of the inductive element and the capacitive element.

28 Claims, 12 Drawing Sheets

(51) Int. Cl.
  *H03K 5/145* (2006.01)
  *H03B 5/12* (2006.01)
  *H03B 5/24* (2006.01)
  *H03K 3/354* (2006.01)
  *H03K 3/03* (2006.01)
  *H03L 7/099* (2006.01)
  *H03K 5/00* (2006.01)

(52) U.S. Cl.
  CPC ............... *H03K 3/354* (2013.01); *H03B 5/18* (2013.01); *H03K 3/0315* (2013.01); *H03K 2005/00286* (2013.01); *H03L 7/0995* (2013.01)

(58) Field of Classification Search
  CPC .... H03B 5/12; H03B 5/18; H03B 5/24; H03L 7/0995
  USPC .......................... 331/57, 117 R, 117 FE, 167
  See application file for complete search history.

(56) References Cited

U.S. PATENT DOCUMENTS

| | | |
|---|---|---|
| 8,044,733 B1 | 10/2011 | Arora et al. |
| 2001/0015681 A1 | 8/2001 | Hino |
| 2008/0290957 A1 | 11/2008 | Li et al. |
| 2009/0072920 A1* | 3/2009 | Wachi .................. H03B 5/1212 331/117 R |
| 2010/0289592 A1 | 11/2010 | Lee et al. |

OTHER PUBLICATIONS

International Search Report for PCT/EP2014/057873, mailed Mar. 4, 2015, 5 pages.
Craninckx, J. et al., "A t8-GHz CMOS Low-Phase-Noise Voltage-Controlled Oscillator with Prescaler," IEEE Journal of Solid-State Circuits, vol. 30, No. 12, Dec. 1995, pp. 1474-1482.

* cited by examiner

SERIES-RESONANCE OSCILLATOR

This application is a 35 U.S.C. §371 national phase filing of International Application No. PCT/EP2014/057873, filed Apr. 17, 2014, the disclosure of which is incorporated herein by reference in its entirety.

FIELD OF THE DISCLOSURE

The present disclosure relates to an oscillator circuit, a method of operating an oscillator circuit, and a wireless communication device comprising an oscillator circuit.

BACKGROUND TO THE DISCLOSURE

Harmonic oscillators known in the art, and implemented in an integrated circuit chip, comprise an inductor and a capacitor, generally known as a tank, operating at a resonance frequency of the tank. Typically, such an oscillator injects a pulse waveform into the tank, which filters out higher current harmonics and generates a sinusoidal voltage waveform at its output. The tank comprises the inductor and capacitor coupled in parallel, and operates in a parallel resonance mode, where the parallel impedance, that is, the impedance of the inductor and capacitor coupled in parallel, is high, generating a relatively high oscillation voltage from a relatively low bias current.

In some applications, for example, in wireless communication apparatus, an oscillator is required that has an extremely low phase noise in combination with a low power consumption. Such a combination is difficult to achieve, particularly if the available power supply voltage $V_{dd}$ is low, as is often the case with present-day nanometer complementary metal oxide semiconductor (CMOS) processes. Increasing the oscillation voltage swing can reduce the phase noise of an oscillator. However, conventional oscillators are limited by the maximum voltage swing they can provide, which ranges from a peak single-ended voltage of $2V_{dd}$ to $3V_{dd}$, the latter being possible in so-called class-D oscillators. Reducing the inductance of the inductor and increasing the capacitance of the capacitor can also decrease the phase noise. However, if the required inductance is very small, for example, a few tens of picoHenrys, this approach can become difficult to manage due to parasitic inductances and resistances of the integrated circuit that start playing a dominant role. Furthermore, the quality factor of very small inductors is lower than for larger inductors, resulting in a higher power consumption for a given phase noise level.

FIG. 1 illustrates a typical Clapp oscillator employing a parallel resonance mode. Referring to FIG. 1, the Clapp oscillator has a first tank $T_A$ comprising a first inductor $L_A$ and a first capacitor $C_A$. The first inductor $L_A$ and the first capacitor $C_A$ are coupled in series to a drain of a first transistor $Q_A$. For providing a differential tank voltage $V_{OUT}$, the Clapp oscillator also has a second tank $T_B$ comprising a second inductor $L_B$ and second capacitor $C_B$. The second inductor $L_B$ and the second capacitor $C_B$ are coupled in series to a drain of a second transistor $Q_B$. The first and second transistors $Q_A$, $Q_B$ have theirs gates biased by a constant bias voltage $V_{DC}$. The Clapp oscillator is a current-mode oscillator, which means that the first and second transistors $Q_A$, $Q_B$ operate as transconductors, providing voltage-to-current conversion, and delivering a large current to their respective first and second tanks $T_A$, $T_B$ without loading the tanks. Therefore, each transconductor must have high parallel impedance. Although the first and second tanks $T_A$, $T_B$ have series coupled inductors and capacitors, the Clapp oscillator does not oscillate at the series resonance frequency of the series coupled inductors and capacitors. Instead, the Clapp oscillator oscillates at a frequency that is determined by all reactive components in the tanks, including the capacitances between the drain and source, and the source and ground, of the first and second transistors $Q_A$, $Q_B$. These capacitances are also represented in FIG. 1. For a given bias current supplied to sources of the first and second transistors $Q_A$, $Q_B$, the oscillation amplitude is proportional to the bias current and an equivalent parallel tank resistance. Therefore, for the current-mode Clapp oscillator with a bias current $I_{BIAS}$ provided by first and second current sources $I_A$, $I_B$ illustrated in FIG. 1, the amplitude of the tank voltage $V_{OUT}$ can be expressed as $$V_{OUT} = k \cdot I_{BIAS} \cdot R_{PEQ} \quad (1)$$

where $R_{PEQ}$ is the equivalent parallel resistance of each of the tanks, which is proportional to the quality factor Q of each of the tanks, and k is a proportionality factor. In the Clapp oscillator, the parallel resistance of each of the tanks is deteriorated by the feedback at the transistor source through the capacitive tap between drain and source and source and ground.

There is a requirement for an improved oscillator.

SUMMARY OF THE PREFERRED EMBODIMENTS

According to a first aspect there is provided an oscillator circuit comprising:

a first tank circuit comprising an inductive element and a capacitive element coupled in series between a voltage rail and a first drive node; and a feedback stage coupled to a first tank output of the first tank circuit and to the first drive node;

wherein the feedback stage is arranged to generate, responsive to a first oscillating tank voltage present at the first tank output, a first oscillating drive voltage at the first drive node in-phase with an oscillating tank current flowing in the inductive element and the capacitive element, thereby causing the oscillator circuit to oscillate in a series resonance mode of the inductive element and the capacitive element.

According to a second aspect there is provided a method of operating an oscillator circuit, the oscillator circuit comprising a first tank circuit comprising an inductive element and a capacitive element coupled in series between a voltage rail and a first drive node, the method comprising generating, responsive to a first oscillating tank voltage present at a first tank output, a first oscillating drive voltage at the first drive node, wherein the first oscillating drive voltage is in-phase with an oscillating tank current flowing in the inductive element and the capacitive element, thereby causing the oscillator to oscillate in a series resonance mode of the inductive element and the capacitive element.

Therefore, the oscillator circuit is voltage driven and oscillates in a series resonance mode. This enables a high amplitude of oscillation with only a low power supply voltage, which enables a low phase noise.

The following embodiments provide different low complexity solutions for implementing the oscillator circuit and method of operating an oscillator circuit.

The feedback stage may be arranged to generate the first oscillating drive voltage having a substantially rectangular waveform. This feature enables a switching device to be used, thereby enabling low power consumption.

In a first preferred embodiment of the oscillator circuit, the first tank circuit may arranged to generate, responsive to the first oscillating drive voltage, the first oscillating tank voltage in-phase with the first oscillating drive voltage, and the feedback stage may comprise a first driver arranged to generate, responsive to the first oscillating tank voltage, the first oscillating drive voltage in-phase with the first oscillating tank voltage. Likewise, a first preferred embodiment of the method may comprise generating the first oscillating tank voltage in-phase with the first oscillating drive voltage, and generating, responsive to the first oscillating tank voltage, the first oscillating drive voltage in-phase with the first oscillating tank voltage. The first preferred embodiment enables a single-ended oscillating signal to be generated in a low complexity manner.

In a variant of the first preferred embodiment of the oscillator circuit, the first tank circuit may be arranged to generate, responsive to the first oscillating drive voltage, the first oscillating tank voltage one hundred and eighty degrees out-of-phase with the first oscillating drive voltage, and the feedback stage may comprise a first driver arranged to generate, responsive to the first oscillating tank voltage, the first oscillating drive voltage one hundred and eighty degrees out-of-phase with the first oscillating tank voltage by applying signal inversion to the first oscillating tank voltage. Likewise, a variant of the first preferred embodiment of the method may comprise generating, responsive to the first oscillating drive voltage, the first oscillating tank voltage one hundred and eighty degrees out-of-phase with the first oscillating drive voltage, and generating, responsive to the first oscillating tank voltage, the first oscillating drive voltage one hundred and eighty degrees out-of-phase with the first oscillating tank voltage by applying signal inversion to the first oscillating tank voltage. This variant enables a single-ended oscillating signal to be generated in a low complexity manner.

In a second preferred embodiment of the oscillator circuit, the first tank circuit may be arranged to generate, responsive to the first oscillating drive voltage, the first oscillating tank voltage in-phase with the first oscillating drive voltage, and the feedback stage may comprise:
a second driver arranged to generate a second oscillating drive voltage by applying signal inversion to the first oscillating tank voltage;
a second tank circuit arranged to generate, responsive to the second oscillating drive voltage, a second oscillating tank voltage in-phase with the second oscillating drive voltage; and
a first driver arranged to generate the first oscillating drive voltage by applying signal inversion to the second oscillating tank voltage.

Likewise, a second preferred embodiment of the method may comprise:
generating, responsive to the first oscillating drive voltage, the first oscillating tank voltage in-phase with the first oscillating drive voltage,
generating a second oscillating drive voltage by applying signal inversion to the first oscillating tank voltage;
generate, responsive to the second oscillating drive voltage, a second oscillating tank voltage in-phase with the second oscillating drive voltage; and
generating the first oscillating drive voltage by applying signal inversion to the second oscillating tank voltage.

The second preferred embodiment enables a balanced oscillating signal to be generated in a low complexity manner. The use of first and second tank circuits enables an accurate phase difference to be provided in a low complexity manner.

In a first variant of the second preferred embodiment of the oscillator circuit, the first tank circuit may be arranged to generate, responsive to the first oscillating drive voltage, the first oscillating tank voltage one hundred and eighty degrees out-of-phase+with the first oscillating drive voltage, and the feedback stage may comprise:
a second driver arranged to generate a second oscillating drive voltage by applying signal inversion to the first oscillating tank voltage;
a second tank circuit arranged to generate, responsive to the second oscillating drive voltage, a second oscillating tank voltage in-phase with the second oscillating drive voltage; and
a first driver arranged to generate the first oscillating drive voltage in-phase with the second oscillating tank voltage.

Likewise, a first variant of the second preferred embodiment of the method may comprise:
generating, responsive to the first oscillating drive voltage, the first oscillating tank voltage one hundred and eighty degrees out-of-phase with the first oscillating drive voltage;
generating a second oscillating drive voltage by applying signal inversion to the first oscillating tank voltage;
generating, responsive to the second oscillating drive voltage, a second oscillating tank voltage in-phase with the second oscillating drive voltage; and
generating the first oscillating drive voltage in-phase with the second oscillating tank voltage.

This first variant enables a balanced oscillating signal to be generated in a low complexity manner, and an accurate phase difference to be provided with low complexity.

In a second variant of the second preferred embodiment of the oscillator circuit, the first tank circuit may be arranged to generate, responsive to the first oscillating drive voltage, the first oscillating tank voltage one hundred and eighty degrees out-of-phase with the first oscillating drive voltage, and the feedback stage may comprise:
a second driver arranged to generate, responsive to the first oscillating tank voltage, a second oscillating drive voltage in-phase with the first oscillating tank voltage;
a second tank circuit arranged to generate, responsive to the second oscillating drive voltage, a second oscillating tank voltage one hundred and eighty degrees out-of-phase with the second oscillating drive voltage; and
a first driver arranged to generate, responsive to the second oscillating tank voltage, the first oscillating drive voltage in-phase with the second oscillating tank voltage.

Likewise, a second variant of the second preferred embodiment of the method may comprise:
generating, responsive to the first oscillating drive voltage, the first oscillating tank voltage one hundred and eighty degrees out-of-phase with the first oscillating drive voltage;
generating, responsive to the first oscillating tank voltage, a second oscillating drive voltage in-phase with the first oscillating tank voltage;
generating, responsive to the second oscillating drive voltage, a second oscillating tank voltage one hundred and eighty degrees out-of-phase with the second oscillating drive voltage; and
generating, responsive to the second oscillating tank voltage, the first oscillating drive voltage in-phase with the second oscillating tank voltage.

This second variant enables a balanced oscillating signal to be generated in a low complexity manner, and an accurate phase difference to be provided with low complexity.

In the first and second preferred embodiments of the oscillator circuit, and their variants, the first tank circuit may comprise a sensor device arranged to generate the first oscillating tank voltage responsive to the first oscillating tank current. Likewise, the first and second preferred embodiments of the method, and their variants, may comprise generating in a sensor device the first oscillating tank voltage responsive to the first oscillating tank current. The sensor device may comprise one of a resistive element and a transformer coupled in series with the first inductive element and the first capacitive element between the voltage rail and the first drive node. Alternatively, the sensor device may be magnetically coupled to the first inductive element for generating by magnetic induction the first oscillating tank voltage responsive to the first oscillating tank current. These features enable feedback to be provided in a low complexity manner.

In a third preferred embodiment of the oscillator circuit, the first tank circuit may be arranged to generate, responsive to the first oscillating drive voltage, the first oscillating tank voltage having a phase lagging by ninety degrees a phase of the first oscillating drive voltage, and the feedback stage may comprise a phase shifting stage arranged to generate a first intermediate oscillating voltage by applying a phase lag of ninety degrees to the first oscillating tank voltage, and a first driver arranged to generate the first oscillating drive voltage by applying signal inversion to the first intermediate oscillating voltage.

Likewise, a third preferred embodiment of the method may comprise:

generating, responsive to the first oscillating drive voltage, the first oscillating tank voltage having a phase lagging by ninety degrees a phase of the first oscillating drive voltage;

generating a first intermediate oscillating voltage by applying a phase lag of ninety degrees to the first oscillating tank voltage; and generating the first oscillating drive voltage by applying signal inversion to the first intermediate oscillating voltage.

The third preferred embodiment enables quadrature-related signals to be generated in a low complexity manner.

In a fourth preferred embodiment of the oscillator circuit, the first tank circuit may be arranged to generate, responsive to the first oscillating drive voltage, the first oscillating tank voltage having a phase leading by ninety degrees a phase of the first oscillating drive voltage, and the feedback stage may comprise a phase shifting stage arranged to generate a first intermediate oscillating voltage by applying a phase lag of ninety degrees to the first oscillating tank voltage, and a first driver arranged to generate the first oscillating drive voltage in response to, and in-phase with, the first intermediate oscillating voltage.

Likewise, a fourth preferred embodiment of the method may comprise:

generating, responsive to the first oscillating drive voltage, the first oscillating tank voltage having a phase leading by ninety degrees a phase of the first oscillating drive voltage;

generating a first intermediate oscillating voltage by applying a phase lag of ninety degrees to the first oscillating tank voltage; and generating the first oscillating drive voltage in response to, and in-phase with, the first intermediate oscillating voltage.

The fourth preferred embodiment enables quadrature-related signals to be generated in a low complexity manner.

In a fifth preferred embodiment of the oscillator circuit, the first tank circuit may be arranged to generate, responsive to the first oscillating drive voltage, the first oscillating tank voltage having a phase lagging by ninety degrees a phase of the first oscillating drive voltage, and the feedback stage may comprise:

a first phase shift circuit arranged to generate a first intermediate oscillating voltage by applying a phase lag of ninety degrees to the first oscillating tank voltage;

a second driver arranged to generate, responsive to the first intermediate oscillating voltage, a second oscillating drive voltage in-phase with the first intermediate oscillating voltage, a second tank circuit arranged to generate, responsive to the second oscillating drive voltage, a second oscillating tank voltage having a phase lagging by ninety degrees a phase of a second oscillating drive voltage;

a second phase shift circuit arranged to generate a second intermediate oscillating voltage by applying a phase lag of ninety degrees to the second oscillating tank voltage; and a first driver arranged to generate, responsive to the second intermediate oscillating voltage, the first oscillating drive voltage in-phase with the second intermediate oscillating voltage.

Likewise, a fifth preferred embodiment of the method may comprise:

generating, responsive to the first oscillating drive voltage, the first oscillating tank voltage having a phase lagging by ninety degrees a phase of the first oscillating drive voltage;

generating a first intermediate oscillating voltage by applying a phase lag of ninety degrees to the first oscillating tank voltage;

generating, responsive to the first intermediate oscillating voltage, a second oscillating drive voltage in-phase with the first intermediate oscillating voltage, generating, responsive to the second oscillating drive voltage, a second oscillating tank voltage having a phase lagging by ninety degrees a phase of a second oscillating drive voltage;

generating a second intermediate oscillating voltage by applying a phase lag of ninety degrees to the second oscillating tank voltage; and generating, responsive to the second intermediate oscillating voltage, the first oscillating drive voltage in-phase with the second intermediate oscillating voltage.

The fifth preferred embodiment enables a balanced oscillating signal to be generated in a low complexity manner.

In a sixth preferred embodiment of the oscillator circuit, the first tank circuit may be arranged to generate, responsive to the first oscillating drive voltage, the first oscillating tank voltage having a phase lagging by ninety degrees a phase of the first oscillating drive voltage, and the feedback stage may comprise:

a first phase shift circuit arranged to generate a first intermediate oscillating voltage by applying a phase lag of ninety degrees to the first oscillating tank voltage;

a second driver arranged to generate a second oscillating drive voltage by applying signal inversion to the first intermediate oscillating voltage;

a second tank circuit arranged to generate, responsive to the second oscillating drive voltage, a second oscillating tank voltage having a phase leading by ninety degrees a phase of the second oscillating drive voltage;

a second phase shift circuit arranged to generate a second intermediate oscillating voltage by applying a phase lag of ninety degrees to the second oscillating tank voltage; and a first driver arranged to generate, responsive to the second intermediate oscillating voltage, the first oscillating drive voltage in-phase with the second intermediate oscillating voltage.

Likewise, a sixth preferred embodiment of the method may comprise:

generate, responsive to the first oscillating drive voltage, the first oscillating tank voltage having a phase lagging by ninety degrees a phase of the first oscillating drive voltage, and the feedback stage may comprise:

a first phase shifter arranged to generate a first intermediate oscillating voltage by applying a phase lag of ninety degrees to the first oscillating tank voltage;

a second driver arranged to generate a second oscillating drive voltage by applying signal inversion to the first intermediate oscillating voltage;

a second tank circuit arranged to generate, responsive to the second oscillating drive voltage, a second oscillating tank voltage having a phase leading by ninety degrees a phase of the second oscillating drive voltage;

a second phase shifter arranged to generate a second intermediate oscillating voltage by applying a phase lag of ninety degrees to the second oscillating tank voltage; and a first driver arranged to generate, responsive to the second intermediate oscillating voltage, the first oscillating drive voltage in-phase with the second intermediate oscillating voltage.

The sixth preferred embodiment enables a balanced oscillating signal to be generated in a low complexity manner.

In a seventh preferred embodiment of the oscillator circuit, the first tank circuit may be arranged to generate, responsive to the first oscillating drive voltage, the first oscillating tank voltage having a phase lagging by ninety degrees a phase of the first oscillating drive voltage, and the feedback stage may comprise:

a second driver arranged to generate a second oscillating drive voltage by applying signal inversion to the first oscillating tank voltage;

a second tank circuit arranged to generate, responsive to the second oscillating drive voltage, a second oscillating tank voltage having a phase lagging by ninety degrees a phase of the second oscillating drive voltage; and a first driver arranged to generate, responsive to the second oscillating tank voltage, the first oscillating drive voltage in-phase with the second oscillating tank voltage.

Likewise, a seventh preferred embodiment of the method may comprise:

generating, responsive to the first oscillating drive voltage, the first oscillating tank voltage having a phase lagging by ninety degrees a phase of the first oscillating drive voltage;

generating a second oscillating drive voltage by applying signal inversion to the first oscillating tank voltage;

generating, responsive to the second oscillating drive voltage, a second oscillating tank voltage having a phase lagging by ninety degrees a phase of the second oscillating drive voltage; and generating, responsive to the second oscillating tank voltage, the first oscillating drive voltage in-phase with the second oscillating tank voltage.

The seventh preferred embodiment enables a balanced oscillating signal to be generated in a low complexity manner.

In an eighth preferred embodiment of the oscillator circuit, the first tank circuit may be arranged to generate, responsive to the first oscillating drive voltage, the first oscillating tank voltage having a phase leading by ninety degrees a phase of the first oscillating drive voltage, and the feedback stage may comprise:

a second driver arranged to generate a second oscillating drive voltage by applying signal inversion to the first oscillating tank voltage;

a second tank circuit arranged to generate, responsive to the second oscillating drive voltage, a second oscillating tank voltage having a phase leading by ninety degrees a phase of the second oscillating drive voltage; and a first driver arranged to generate, responsive to the second oscillating tank voltage, the first oscillating drive voltage in-phase with the second oscillating tank voltage.

Likewise, an eighth preferred embodiment of the method may comprise:

generating, responsive to the first oscillating drive voltage, the first oscillating tank voltage having a phase leading by ninety degrees a phase of the first oscillating drive voltage;

generating a second oscillating drive voltage by applying signal inversion to the first oscillating tank voltage;

generating, responsive to the second oscillating drive voltage, a second oscillating tank voltage having a phase leading by ninety degrees a phase of the second oscillating drive voltage; and generating, responsive to the second oscillating tank voltage, the first oscillating drive voltage in-phase with the second oscillating tank voltage.

The eighth preferred embodiment enables quadrature-related signals to be generated in a low complexity manner.

In a ninth preferred embodiment of the oscillator circuit, the first tank circuit may be arranged to generate, responsive to the first oscillating drive voltage, the first oscillating tank voltage having a phase leading by ninety degrees a phase of the first oscillating drive voltage, and the feedback stage may comprise:

a second driver arranged to generate, responsive to the first oscillating tank voltage, a second oscillating drive voltage in-phase with the first oscillating tank voltage;

a second tank circuit arranged to generate, responsive to the second oscillating drive voltage, a second oscillating tank voltage having a phase lagging by ninety degrees a phase of the second oscillating drive voltage; and a first driver arranged to generate, responsive to the second oscillating tank voltage, the first oscillating drive voltage in-phase with the second oscillating tank voltage.

Likewise, a ninth preferred embodiment of the method may comprise:

generating, responsive to the first oscillating drive voltage, the first oscillating tank voltage having a phase leading by ninety degrees a phase of the first oscillating drive voltage;

generating, responsive to the first oscillating tank voltage, a second oscillating drive voltage in-phase with the first oscillating tank voltage;

generating, responsive to the second oscillating drive voltage, a second oscillating tank voltage having a phase lagging by ninety degrees a phase of the second oscillating drive voltage; and generating, responsive to the second oscillating tank voltage, the first oscillating drive voltage in-phase with the second oscillating tank voltage.

The ninth preferred embodiment enables quadrature-related oscillating signals to be generated in a low complexity manner.

In a tenth preferred embodiment of the oscillator circuit, the first tank circuit may be arranged to generate, responsive to the first oscillating drive voltage, the first oscillating tank voltage having a phase lagging by ninety degrees a phase of the first oscillating drive voltage, and the feedback stage may comprise:

a second driver arranged to generate, responsive to the first oscillating tank voltage, a second oscillating drive voltage in-phase with the first oscillating tank voltage;

a second tank circuit arranged to generate, responsive to the second oscillating drive voltage, a second oscillating tank voltage having a phase lagging by ninety degrees a phase of the second oscillating drive voltage;

a third driver arranged to generate, responsive to the second oscillating tank voltage, a third oscillating drive voltage in-phase with the second oscillating tank voltage;

a third tank circuit arranged to generate, responsive to the third oscillating drive voltage, a third oscillating tank voltage having a phase lagging by ninety degrees a phase of the third oscillating drive voltage;

a fourth driver arranged to generate, responsive to the third oscillating tank voltage, a fourth oscillating drive voltage in-phase with the third oscillating tank voltage;

a fourth tank circuit arranged to generate, responsive to the fourth oscillating drive voltage, a fourth oscillating tank voltage having a phase lagging by ninety degrees a phase of the fourth oscillating drive voltage; and a first driver arranged to generate, responsive to the fourth oscillating tank voltage, the first oscillating drive voltage in-phase with the fourth oscillating tank voltage.

Likewise, a tenth preferred embodiment of the method may comprise:

generating, responsive to the first oscillating drive voltage, the first oscillating tank voltage having a phase lagging by ninety degrees a phase of the first oscillating drive voltage;

generating, responsive to the first oscillating tank voltage, a second oscillating drive voltage in-phase with the first oscillating tank voltage;

generating, responsive to the second oscillating drive voltage, a second oscillating tank voltage having a phase lagging by ninety degrees a phase of the second oscillating drive voltage;

generating, responsive to the second oscillating tank voltage, a third oscillating drive voltage in-phase with the second oscillating tank voltage;

generating, responsive to the third oscillating drive voltage, a third oscillating tank voltage having a phase lagging by ninety degrees a phase of the third oscillating drive voltage;

generating, responsive to the third oscillating tank voltage, a fourth oscillating drive voltage in-phase with the third oscillating tank voltage;

generating, responsive to the fourth oscillating drive voltage, a fourth oscillating tank voltage having a phase lagging by ninety degrees a phase of the fourth oscillating drive voltage; and generating, responsive to the fourth oscillating tank voltage, the first oscillating drive voltage in-phase with the fourth oscillating tank voltage.

The tenth preferred embodiment enables quadrature-related balanced oscillating signals to be generated in a low complexity manner.

In an eleventh preferred embodiment of the oscillator circuit, the first tank circuit may be arranged to generate, responsive to the first oscillating drive voltage, the first oscillating tank voltage having a phase leading by ninety degrees a phase of the first oscillating drive voltage, and the feedback stage may comprise:

a second driver arranged to generate, responsive to the first oscillating tank voltage, a second oscillating drive voltage in-phase with the first oscillating tank voltage;

a second tank circuit arranged to generate, responsive to the second oscillating drive voltage, a second oscillating tank voltage having a phase leading by ninety degrees a phase of the second oscillating drive voltage;

a third driver arranged to generate, responsive to the second oscillating tank voltage, a third oscillating drive voltage in-phase with the second oscillating tank voltage;

a third tank circuit arranged to generate, responsive to the third oscillating drive voltage, a third oscillating tank voltage having a phase leading by ninety degrees a phase of the third oscillating drive voltage;

a fourth driver arranged to generate, responsive to the third oscillating tank voltage, a fourth oscillating drive voltage in-phase with the third oscillating tank voltage;

a fourth tank circuit arranged to generate, responsive to the fourth oscillating drive voltage, a fourth oscillating tank voltage having a phase leading by ninety degrees a phase of the fourth oscillating drive voltage; and a first driver arranged to generate, responsive to the fourth oscillating tank voltage, the first oscillating drive voltage in-phase with the fourth oscillating tank voltage.

Likewise, an eleventh preferred embodiment of the method may comprise:

generating, responsive to the first oscillating drive voltage, the first oscillating tank voltage having a phase leading by ninety degrees a phase of the first oscillating drive voltage;

generating, responsive to the first oscillating tank voltage, a second oscillating drive voltage in-phase with the first oscillating tank voltage;

generating, responsive to the second oscillating drive voltage, a second oscillating tank voltage having a phase leading by ninety degrees a phase of the second oscillating drive voltage;

generating, responsive to the second oscillating tank voltage, a third oscillating drive voltage in-phase with the second oscillating tank voltage;

generating, responsive to the third oscillating drive voltage, a third oscillating tank voltage having a phase leading by ninety degrees a phase of the third oscillating drive voltage;

generating, responsive to the third oscillating tank voltage, a fourth oscillating drive voltage in-phase with the third oscillating tank voltage;

generating, responsive to the fourth oscillating drive voltage, a fourth oscillating tank voltage having a phase leading by ninety degrees a phase of the fourth oscillating drive voltage; and generating, responsive to the fourth oscillating tank voltage, the first oscillating drive voltage in-phase with the fourth oscillating tank voltage.

The eleventh preferred embodiment enables quadrature-related balanced oscillating signals to be generated in a low complexity manner.

In the tenth and eleventh preferred embodiment of the oscillator circuit, the first driver may comprise:

a first transistor having a drain coupled to a first power supply rail, a source coupled to an output of the first driver, and a gate coupled to an input of the first driver by a first coupling capacitor, and a second transistor having a drain coupled to the output of the first driver, a source coupled to a second power supply rail, and a gate coupled to the first power supply rail by a first resistor;

and the third driver may comprise:

a third transistor having a drain coupled to the first power supply rail, a source coupled to an output of the third driver, and a gate coupled to an input of the third driver by a second coupling capacitor, and a fourth transistor having a drain coupled to the output of the third driver, and a source coupled to the first power supply rail by a second resistor; wherein the gate of the first transistor is coupled to a gate of the fourth transistor, and the gate of the third transistor is coupled to the gate of the second transistor; and wherein the first, second, third and fourth transistors are n-channel complementary metal oxide silicon, CMOS, transistors.

The use of n-channel CMOS transistors, rather than p-channel CMOS transistors, for coupling the first and third tank circuits to the third power supply rail enables the transistors to be implemented with less integrated circuit chip area and less parasitic capacitance.

In a twelfth preferred embodiment of the oscillator circuit, the first tank circuit may be arranged to generate, responsive to the first oscillating drive voltage, the first oscillating tank voltage having a phase lagging by ninety degrees a phase of the first oscillating drive voltage, and the feedback stage may comprise:

a second driver arranged to generate a second oscillating drive voltage by applying signal inversion to the first oscillating tank voltage;

a second tank circuit arranged to generate, responsive to the second oscillating drive voltage, a second oscillating tank voltage having a phase lagging by ninety degrees a phase of the second oscillating drive voltage;

a third driver arranged to generate a third oscillating drive voltage by applying signal inversion to the second oscillating tank voltage;

a third tank circuit arranged to generate, responsive to the third oscillating drive voltage, a third oscillating tank voltage having a phase lagging by ninety degrees a phase of the third oscillating drive voltage;

a fourth driver arranged to generate a fourth oscillating drive voltage by applying signal inversion to the third oscillating tank voltage;

a fourth tank circuit arranged to generate, responsive to the fourth oscillating drive voltage, a fourth oscillating tank voltage having a phase lagging by ninety degrees a phase of the fourth oscillating drive voltage; and a first driver arranged to generate the first oscillating drive voltage by applying signal inversion to the fourth oscillating tank voltage.

Likewise, a twelfth preferred embodiment of the method may comprise:

generating, responsive to the first oscillating drive voltage, the first oscillating tank voltage having a phase lagging by ninety degrees a phase of the first oscillating drive voltage;

generating a second oscillating drive voltage by applying signal inversion to the first oscillating tank voltage;

generating, responsive to the second oscillating drive voltage, a second oscillating tank voltage having a phase lagging by ninety degrees a phase of the second oscillating drive voltage;

generating a third oscillating drive voltage by applying signal inversion to the second oscillating tank voltage;

generating, responsive to the third oscillating drive voltage, a third oscillating tank voltage having a phase lagging by ninety degrees a phase of the third oscillating drive voltage;

generating a fourth oscillating drive voltage by applying signal inversion to the third oscillating tank voltage;

generating, responsive to the fourth oscillating drive voltage, a fourth oscillating tank voltage having a phase lagging by ninety degrees a phase of the fourth oscillating drive voltage; and generating the first oscillating drive voltage by applying signal inversion to the fourth oscillating tank voltage.

The twelfth preferred embodiment enables quadrature-related balanced oscillating signals to be generated in a low complexity manner.

In a thirteenth preferred embodiment of the oscillator circuit, the first tank circuit may be arranged to generate, responsive to the first oscillating drive voltage, the first oscillating tank voltage having a phase leading by ninety degrees a phase of the first oscillating drive voltage, and the feedback stage may comprise:

a second driver arranged to generate a second oscillating drive voltage by applying signal inversion to the first oscillating tank voltage;

a second tank circuit arranged to generate, responsive to the second oscillating drive voltage, a second oscillating tank voltage having a phase leading by ninety degrees a phase of the second oscillating drive voltage;

a third driver arranged to generate a third oscillating drive voltage by applying signal inversion to the second oscillating tank voltage;

a third tank circuit arranged to generate, responsive to the third oscillating drive voltage, a third oscillating tank voltage having a phase leading by ninety degrees a phase of the third oscillating drive voltage;

a fourth driver arranged to generate a fourth oscillating drive voltage by applying signal inversion to the third oscillating tank voltage;

a fourth tank circuit arranged to generate, responsive to the fourth oscillating drive voltage, a fourth oscillating tank voltage having a phase leading by ninety degrees a phase of the fourth oscillating drive voltage; and a first driver arranged to generate the first oscillating drive voltage by applying signal inversion to the fourth oscillating tank voltage.

Likewise, a thirteenth preferred embodiment of the method may comprise:

generating, responsive to the first oscillating drive voltage, the first oscillating tank voltage having a phase leading by ninety degrees a phase of the first oscillating drive voltage;

generating a second oscillating drive voltage by applying signal inversion to the first oscillating tank voltage;

generating, responsive to the second oscillating drive voltage, a second oscillating tank voltage having a phase leading by ninety degrees a phase of the second oscillating drive voltage;

generating a third oscillating drive voltage by applying signal inversion to the second oscillating tank voltage;

generating, responsive to the third oscillating drive voltage, a third oscillating tank voltage having a phase leading by ninety degrees a phase of the third oscillating drive voltage;

generating a fourth oscillating drive voltage by applying signal inversion to the third oscillating tank voltage;

generating, responsive to the fourth oscillating drive voltage, a fourth oscillating tank voltage having a phase leading by ninety degrees a phase of the fourth oscillating drive voltage; and generating the first oscillating drive voltage by applying signal inversion to the fourth oscillating tank voltage.

The thirteenth preferred embodiment enables quadrature-related balanced oscillating signals to be generated in a low complexity manner.

In the third, fifth, sixth, seventh, tenth and twelfth preferred embodiments of the oscillator circuit, the capacitive element may be coupled between the first drive node and the first tank output and the inductive element may be coupled between the first tank output and the first voltage rail.

In the first, second, fourth, eighth, ninth, eleventh and thirteenth preferred embodiments of the oscillator circuit, the inductive element may be coupled between the first drive node and the first tank output and the capacitive element may be coupled between the first tank output and the first voltage rail.

The third to ninth preferred embodiments may comprise a variable capacitance element coupled between the first tank output and the second tank output. This feature enables a frequency of oscillation to be varied.

In the tenth and eleventh preferred embodiments, the second driver may comprise:

a fifth transistor having a drain coupled to a third power supply rail, a source coupled to an output of the second driver, and a gate coupled to an input of the second driver by a third coupling capacitor; and a sixth transistor having a drain coupled to the output of the second driver, a source coupled to a fourth power supply rail, and a gate coupled to the third power supply rail by a third resistor;

the fourth driver may comprise:

a seventh transistor having a drain coupled to the third power supply rail, a source coupled to an output of the fourth driver, and a gate coupled to an input of the fourth driver by a fourth coupling capacitor and an eighth transistor having a drain coupled to the output of the fourth driver, a source coupled to the fourth power supply rail, and a gate coupled to the third power supply rail by a fourth resistor;

wherein the gate of the fifth transistor may be coupled to the gate of the eighth transistor, and the gate of the seventh transistor may be coupled to the gate of the sixth transistor; and wherein the fifth, sixth, seventh and eighth transistors may be n-channel CMOS transistors.

The use of n-channel CMOS transistors, rather than p-channel CMOS transistors, for coupling the second and fourth tank circuits to the third power supply rail, and for coupling the fifth and seventh transistors to the fifth power supply rail, enables the transistors to be implemented with less integrated circuit chip area and less parasitic capacitance.

In the second and fifth to ninth preferred embodiments of the oscillator circuit, and their variants, the first tank circuit and the second tank circuit may have an equal resonance frequency. In the tenth to thirteenth preferred embodiments of the oscillator circuits, the first, second, third and fourth tank circuits may have an equal resonance frequency. These features enable high power efficiency.

In the second and fifth to ninth preferred embodiments of the oscillator circuit, and their variants, the first tank circuit and the second tank circuit may have an equal capacitance and an equal inductance. In the tenth to thirteenth preferred embodiments of the oscillator circuits, the first, second, third and fourth tank circuits may have an equal capacitance and an equal inductance. These features enable close matching of resonance frequencies.

There is also provided a wireless communication device comprising an oscillator circuit according to the first aspect.

Preferred embodiments are described, by way of example only, with reference to the accompanying drawings.

DETAILED DESCRIPTION OF PREFERRED EMBODIMENTS

Figure 1:
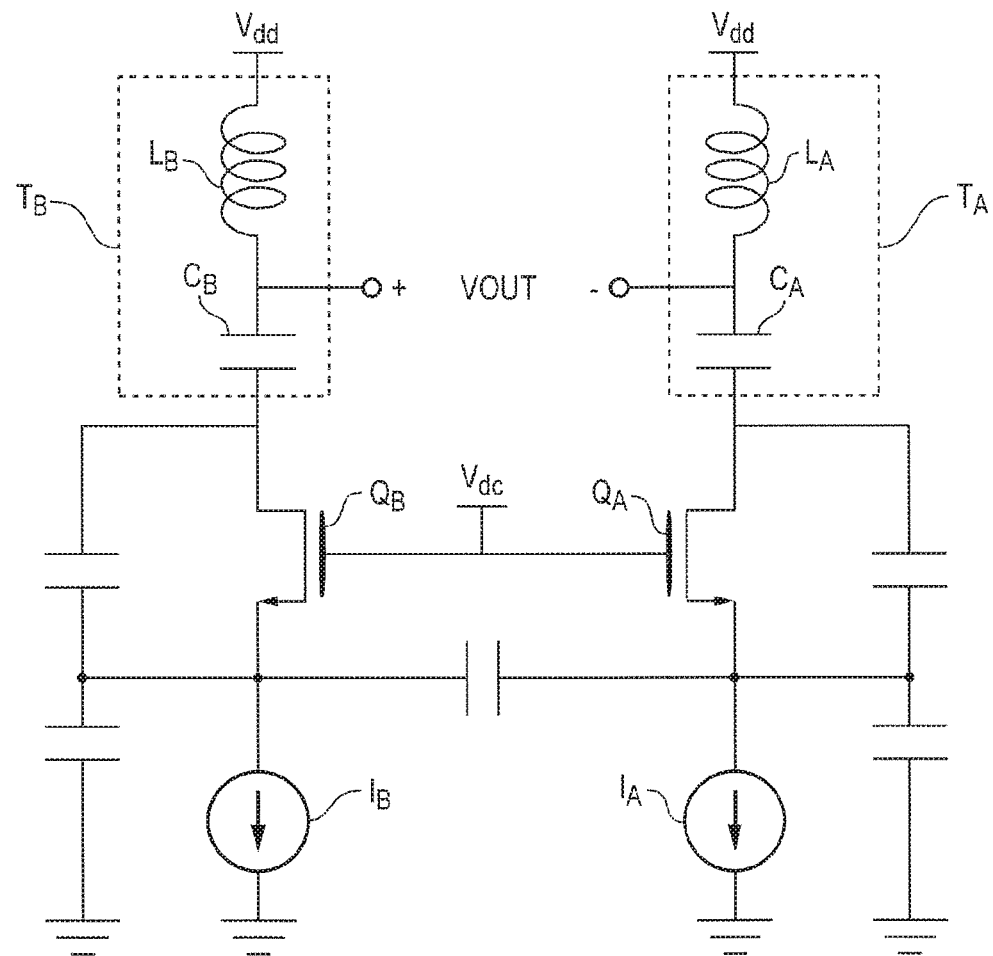
FIG. 1 is a schematic diagram of a prior art oscillator.
Figure 2:
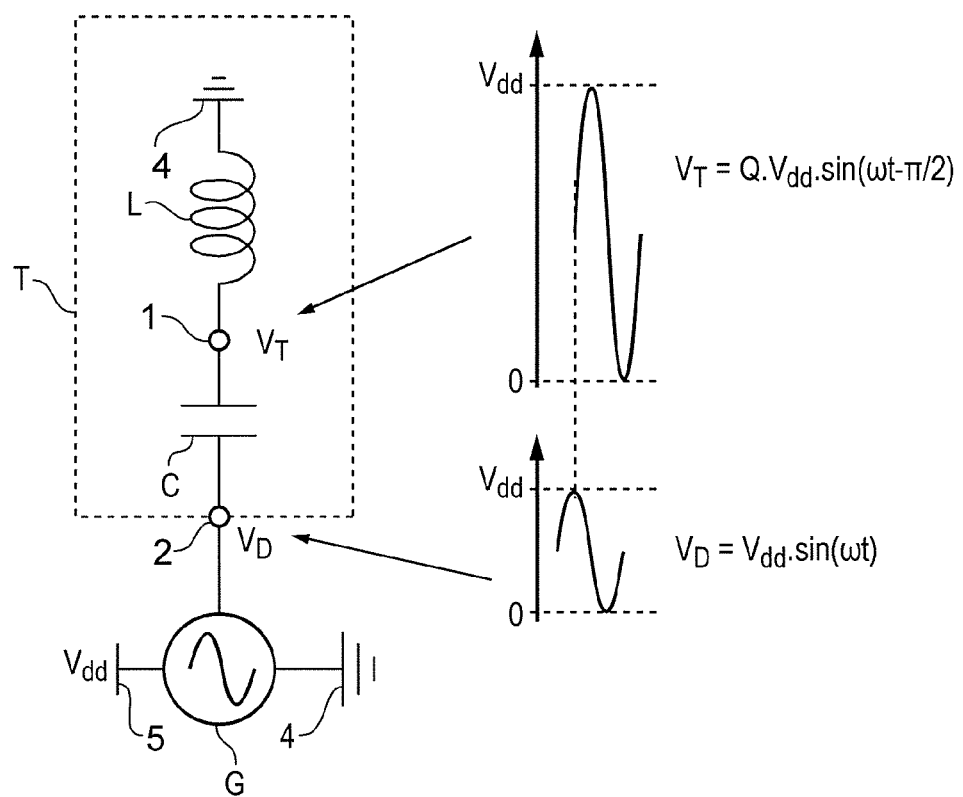
FIG. 2 is a schematic diagram illustrating the principle of operation of an oscillator employing voltage driven series resonance.

In the following description, an oscillator topology is disclosed that employs series resonance between an inductor and a capacitor, rather than the parallel resonance of conventional oscillators, and in which the tank formed by the inductor and capacitor is voltage driven. The principle of operation of an oscillator circuit employing voltage driven, or voltage-mode, series resonance is described with reference to FIG. 2. Referring to FIG. 2, an inductor, or inductive element, L and a capacitor, or capacitive element, C are coupled in series, and thereby constitute a tank circuit T, or resonator. The inductive element L is coupled between a voltage rail at ground potential, and a junction 1, and the capacitive element C is coupled between the junction 1 and a drive node 2. Therefore, the inductive element L and the capacitive C are coupled together at the junction 1. If a sinusoidal drive, or excitation, voltage $V_D = V_{dd} \cdot \sin(\omega t)$, where $V_{dd}$ is a voltage supplied by a power supply node 5, $\omega$ is the resonance frequency in radians per second of the series coupled inductive element L and capacitive element C, and t is time, is applied at the drive node 2 by a voltage generator G, a tank voltage $V_T = Q \cdot V_{dd} \cdot \sin(\omega t - \pi/2)$, where Q is the quality factor of the series coupled inductive element L and capacitive element C, is generated at the junction 1. Therefore, the amplitude of the tank voltage $V_T$ is Q times the amplitude of the drive voltage $V_D$, and is shifted, that is, delayed, in phase by $\pi/2$ radians, that is, 90°, relative to the drive voltage $V_D$. Typically, for present-day integrated circuit processes, the quality factor Q can be ten, and therefore the tank voltage $V_T$ can be high when the drive voltage $V_D$ is small. It is not essential for the drive voltage $V_D$ to be sinusoidal, and alternatively it may have, for example, a square or rectangular waveform, or an approximately square or rectangular waveform having finite rise and fall times.

For the voltage-mode series resonance oscillator illustrated in FIG. 2, the amplitude of the tank voltage $V_T$, can be expressed as $$k \cdot \omega L \cdot V_{dd}/R_{SEQ} = k \cdot Q \cdot V_{BIAS} \qquad (2)$$

where $\omega L$ is the impedance of the inductive element L at the resonance frequency $\omega$, $V_{dd}$ is the amplitude, determined by the power supply node 5, of the drive voltage $V_D$ driving the series resonance, $R_{SEQ}$ is the equivalent series tank resistance, Q is the quality factor of the tank comprising the inductive element L and the capacitive element C, and k is a proportionality factor.

A comparison between equations (1) and (2) reveals significant differences between the voltage-mode series resonance oscillator and a current-mode parallel resonance oscillator. In the current-mode parallel resonance oscillator, the oscillation amplitude is proportional to the bias current $I_{BIAS}$, and if the tank quality factor Q is high, that is, if the parallel tank resistance is high, the bias current $I_{BIAS}$ is low. Furthermore, the power supply voltage of the current-mode parallel resonance oscillator limits the maximum oscillation amplitude. In the voltage-mode series resonance oscillator, if the tank quality factor Q is high, that is, the series tank resistance is low, the current drawn from a power supply is high, and the oscillation amplitude is also high, the tank quality factor Q being inversely proportional to the series tank resistance. Furthermore, in the voltage-mode series resonance oscillator, no straightforward limitation to the amplitude of the oscillation is imposed by the value of the power supply voltage $V_{dd}$, which enables a very high oscillation amplitude in the presence of a very low power supply voltage, if the tank quality factor Q is sufficiently high. This can enable a very low phase noise of the oscillator, albeit with a large current from the power supply.

Continuing with reference to FIG. 2, the drive voltage $V_D$ and the tank voltage $V_T$ have a quadrature phase relationship, or, expressed more concisely, are in quadrature. In particular, the phase of the drive voltage $V_D$ leads the phase of the tank voltage $V_T$ by 90°. In other words, the phase of the drive voltage $V_D$ lags the phase of the tank voltage $V_T$ by 90°. However, alternative configurations of the tank may be used, as described below, in which different phase relationships apply between the drive voltage $V_D$ and the tank voltage $V_T$. In a practical embodiment of an oscillator circuit employing the series resonance of a tank, the oscillator circuit itself can provide the drive voltage $V_D$. For example, the drive voltage $V_D$ can be generated from the tank voltage $V_T$, or generated by switching on and off the power supply voltage $V_{dd}$. Where the drive voltage $V_D$ is generated from the tank voltage $V_T$, it is necessary to ensure the required phase relationship between the tank voltage $V_T$ and the drive voltage $V_D$ for providing positive feedback to sustain oscillation.

Figure 3:
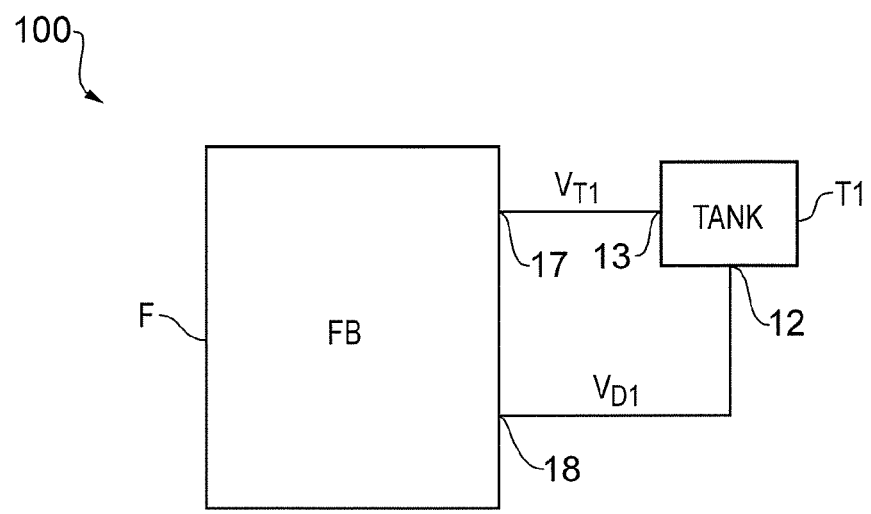
FIG. 3 is a schematic diagram of an oscillator circuit.

Referring to FIG. 3, an oscillator circuit 100 comprises a first tank circuit T1 and a feedback (FB) stage F. The first tank circuit T1 has a first drive node 12 at which a first oscillating drive voltage $V_{D1}$ is applied to the first tank circuit T1, and a first tank output 13 at which the first oscillating tank voltage $V_{T1}$ is delivered from the first tank circuit T1. The first tank circuit T1 of FIG. 3 may have one of several alternative tank configurations, which are described below, of an inductive element L and a capacitive element C coupled in series between the first drive node 12 and a voltage rail 14. The feedback stage F has an input 17 coupled to the first tank output 13 for receiving the first oscillating tank voltage $V_{T1}$, and an output 18 coupled to the first drive node 12 for delivering the first oscillating drive voltage $V_{D1}$ to the first drive node 12. The feedback stage F has one of several different feedback configurations as described below, and is arranged to generate, responsive to the first oscillating tank voltage $V_{T1}$, the first oscillating drive voltage $V_{D1}$ in-phase with an oscillating tank current $I_T$ flowing in the inductive element L and the capacitive element C between the first drive node 12 and the voltage rail 14, thereby causing the oscillator circuit 100 to oscillate in a series resonance mode of the inductive element L and the capacitive element C.

Tank configurations of the first tank circuit T1 are described with reference to FIGS. 4 to 8. In each of these tank configurations, the capacitive element C and the inductive element L are coupled in series between the first drive node 12 and the voltage rail 14, which may be at ground potential or another potential.

Figure 4:
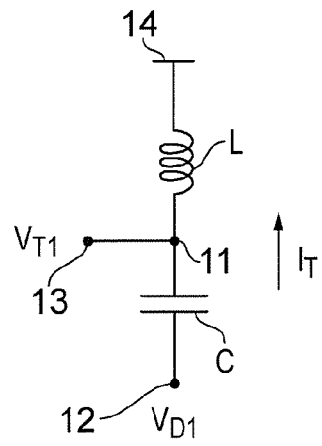
FIGS. 4 to 8 are schematic diagrams illustrating different tank configurations of a tank circuit.

Referring to FIG. 4, a first tank configuration of the first tank circuit T1 has the capacitive element C coupled between the first drive node 12 and a junction 11, and the inductive element L coupled between the junction 11 and the voltage rail 14. This first tank configuration, therefore, corresponds to the configuration of the tank circuit T illustrated in FIG. 2. The junction 11 is coupled to the first tank output 13. In this first tank configuration, the first oscillating tank voltage $V_{T1}$ present at the first tank output 13 has a phase that lags a phase of the first oscillating drive voltage $V_{D1}$ by 90°.

Figure 5:
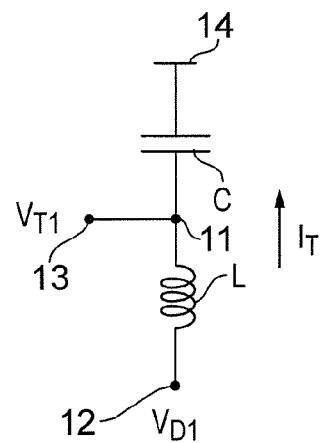

Referring to FIG. 5, a second tank configuration of the first tank circuit T1 has the inductive element L coupled between the first drive node 12 and the junction 11, and the capacitive element C coupled between the junction 11 and the voltage rail 14. The junction 11 is coupled to the first tank output 13. This second tank configuration, therefore, corresponds to the first tank configuration illustrated in FIG. 4, but with the position of the inductive element L and the capacitive element C swapped. In this second tank configuration, the first oscillating tank voltage $V_{T1}$ has a phase that leads a phase of the first oscillating drive voltage $V_{D1}$ by 90°.

Figure 6:
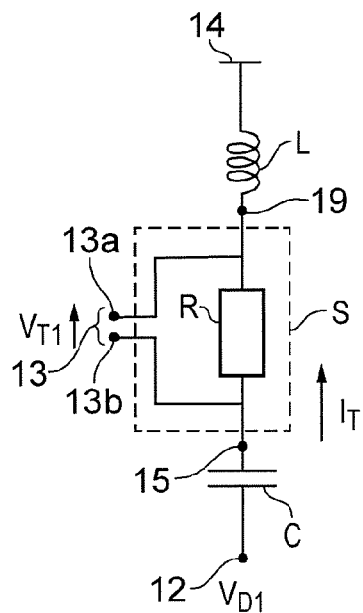

Referring to FIG. 6, a third tank configuration of the first tank circuit T1 has a sensor device S coupled in series with the inductive element L and the capacitive element C between the first drive node 12 and the voltage rail 14. In particular, the sensor device S is coupled between the inductive element L and the capacitive element C, although in non-illustrated variants of the third tank configuration, the sensor device S may instead be coupled between the first drive node 12 and the capacitive element C, or between the inductive element L and the voltage rail 14. In further non-illustrated variants of the third tank configuration, the position of the inductive element L and the capacitive element C may be swapped, such that the sensor device S is coupled between the inductive element L and the capacitive element C, with the capacitive element C coupled between the voltage rail 14 and the sensor device S, and the inductive element L coupled between the first drive node 12 and the sensor device S, or the sensor device S instead be coupled between the first drive node 12 and the inductive element L, or the sensor device S instead coupled between the voltage rail 14 and the capacitive element C. The oscillating tank current $I_T$ flows in response to the first oscillating drive voltage $V_{D1}$, and the sensor device S is arranged to generate the first oscillating tank voltage $V_{T1}$ responsive to the oscillating tank current $I_T$. In particular, in the third tank configuration illustrated in FIG. 6, the sensor device S comprises a resistive element R, and the first tank output 13 comprises a pair of terminals 13a, 13b coupled to different terminals of the resistive element R. The oscillating tank current $I_T$ flows through the resistive element R, thereby giving rise to the first oscillating tank voltage $V_{T1}$ across the resistive element R, and hence between the pair of terminals 13a, 13b. In those variants of the third tank configuration in which one of the terminals of the resistive element R is coupled directly to the voltage rail 14, rather than via the inductive element L or via the capacitive element C, the first tank output 13 may instead be coupled to only the other terminal of the resistive element R, that is not coupled directly to the voltage rail 14. The oscillating tank current $I_T$ is in-phase with the first oscillating drive voltage $V_{D1}$, and the first oscillating tank voltage $V_{T1}$ is in-phase with the oscillating tank current $I_T$, and therefore is in-phase with the first oscillating drive voltage $V_{D1}$.

Figure 7:
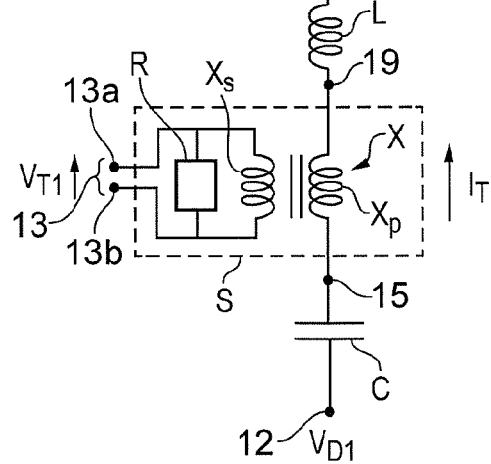

Referring to FIG. 7, a fourth tank configuration of the first tank circuit T1 has a sensor device S coupled in series with the inductive element L and the capacitive element C between the first drive node 12 and the voltage rail 14. In particular, the sensor device S is coupled between the inductive element L and the capacitive element C, although the alternative positions of the sensor device S described above with reference to FIG. 6 are also applicable to the sensor device S illustrated in the tank configuration of FIG. 7. The oscillating tank current $I_T$ flows in response to the first oscillating drive voltage $V_{D1}$, and the sensor device S illustrated in FIG. 7 is arranged to generate the first oscillating tank voltage $V_{T1}$ responsive to the oscillating tank current $I_T$. In particular, in the fourth tank configuration illustrated in FIG. 7, the sensor device S comprises a transformer X having a primary winding $X_P$ coupled in series with the inductive element L and the capacitive element C between the first drive node 12 and the voltage rail 14, a secondary winding $X_S$ coupled to a pair of terminals 13a, 13b of the first tank output 13, and a resistive element R coupled between the pair of terminals 13a, 13b in parallel with the secondary winding X. The resistive element R has a smaller resistance, for example one tenth or less, than the impedance of the secondary winding $X_S$ at the frequency of oscillation. The oscillating tank current $I_T$ flows through the primary winding $X_P$, thereby giving rise to an oscillating sensor current flowing in the secondary winding X. The oscillating sensor current flows in the secondary winding $X_S$ and the resistive element R, and hence gives rise to the first oscillating tank voltage $V_{T1}$ between the pair of terminals 13a, 13b. Optionally, one terminal of the pair of terminals 13a, 13b may be coupled to the voltage rail 14, or to another voltage rail, in which case the first tank output 13 may instead comprise a single one of the terminals of the pair of terminals 13a, 13b. The oscillating tank current $I_T$ is in-phase with the first oscillating drive voltage $V_{D1}$, and consequently the oscillating sensor current flowing in the secondary winding $X_S$ and the resistive element R is in-phase with the oscillating tank current $I_T$ and the first oscillating drive voltage $V_{D1}$. Flow of the oscillating sensor current in the resistive element R gives rise to the first oscillating tank voltage $V_{T1}$ in-phase with the oscillating sensor current. Therefore, the first oscillating tank voltage $V_{T1}$ at the first tank output 13 is in-phase with the oscillating tank current $I_T$, and therefore is in-phase with the first oscillating drive voltage $V_{D1}$. In a variation of the fourth tank configuration described with reference to FIG. 7, the resistive element R may be replaced by a trans-resistance amplifier having inputs coupled to respective terminals of the secondary winding $X_S$, instead of the secondary winding $X_S$ being coupled directly to the pair of terminals 13a, 13b of the first tank output 13, and an output of the trans-resistance amplifier coupled to the first tank output 13, or the pair of terminals 13a, 13b of the first tank output 13.

Figure 8:
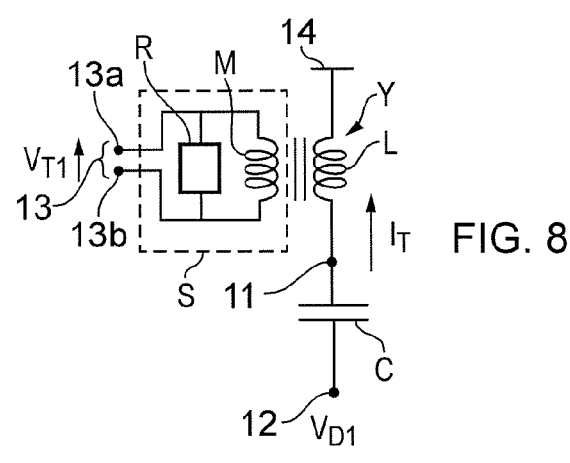

Referring to FIG. 8, a fifth tank configuration of the first tank circuit T1 comprises the inductive element L and the capacitive element C arranged as illustrated in FIG. 4, or alternatively they may be arranged as illustrated in FIG. 5. The first tank circuit T1 of FIG. 8 further comprises a sensor device S magnetically coupled to the inductive element L. In particular, the inductive element L and a coil M of the sensor device S are coupled magnetically thereby forming a transformer Y, with the inductive element L being a primary winding of the transformer Y and the coil M being a secondary winding of the transformer Y. The coil M is coupled to a pair of terminals 13a, 13b of the first tank output 13, and a resistive element R is coupled between the pair of terminals 13a, 13b in parallel with the coil M. The resistive element R has a smaller resistance, for example one tenth or less, than the impedance of the coil M at the frequency of oscillation. In response to the first oscillating drive voltage $V_{D1}$, the oscillating tank current $I_T$ flows through the inductive element L, thereby giving rise to an oscillating sensor current flowing in the coil M. The oscillating sensor current flows in the coil M and the resistive element R, and hence gives rise to the first oscillating tank voltage $V_{T1}$ between the pair of terminals 13a, 13b. Therefore, the sensor device S of FIG. 8 is arranged to generate the first oscillating tank voltage $V_{T1}$ responsive to the oscillating tank current $I_T$ by magnetic induction. Optionally, one terminal of the pair of terminals 13a, 13b may be coupled to the voltage rail 14, or to another voltage rail, in which case the first tank output 13 may instead comprise a single one of the terminals of the pair of terminals 13a, 13b. The oscillating tank current $I_T$ is in-phase with the first oscillating drive voltage $V_{D1}$, and consequently the oscillating sensor current flowing in the coil M and the resistive element R is in-phase with the oscillating tank current $I_T$ and the first oscillating drive voltage $V_{D1}$. Flow of the oscillating sensor current in the resistive element R gives rise to the first oscillating tank voltage $V_{T1}$ in-phase with the oscillating sensor current. Therefore, the first oscillating tank voltage $V_{T1}$ at the first tank output 13 is in-phase with the oscillating tank current $I_T$, and therefore is in-phase with the first oscillating drive voltage $V_{D1}$. In a variation of the fifth tank configuration described with reference to FIG. 8, the resistive element R may be replaced by a trans-resistance amplifier having inputs coupled to respective terminals of the coil M, instead of the coil M being coupled directly to the pair of terminals 13a, 13b of the first tank output 13, and an output of the trans-resistance amplifier coupled to the first tank output 13, or the pair of terminals 13a, 13b of the first tank output 13.

In a modified version of the third, fourth or fifth tank configurations, or their variants described above, connections of the sensor S to the pair of terminals 13a, 13b may be swapped, thereby inverting the first oscillating tank voltage $V_{T1}$, or, equivalently, modifying the phase of the first oscillating tank voltage $V_{T1}$ by 180°. In this case, although the oscillating tank current $I_T$ is in-phase with the first drive voltage $V_{D1}$, the first oscillating tank voltage $V_{T1}$ is 180° out-of-phase with the oscillating tank current $I_T$, and therefore is 180° out-of-phase with the first oscillating drive voltage $V_{D1}$.

Embodiments of the oscillator circuit 100 comprising the different tank configurations of the first tank circuit T1 described with reference to FIGS. 4 to 8, and having different feedback configurations of the feedback stage F, are described below with reference to FIGS. 9 to 19. Some of these embodiments comprise a second tank circuit T2, in addition to the first tank circuit T1, and some of these embodiments further comprise a third tank circuit T3 and fourth tank circuit T4, in addition to the first and second tank circuits T1, T2. Such second, third and fourth tank circuits T2, T3, T4 may each have a tank configuration corresponding to one of the first to fifth tank configurations described with reference to FIGS. 4 to 8, and therefore have respective second, third and fourth drive nodes referenced 22, 32, 42 at which respective second, third and fourth oscillating drive voltages $V_{D2}$, $V_{D3}$, $V_{D4}$ are applied, and respective second, third and fourth tank outputs referenced 23, 33, 43 at which respective second, third and fourth oscillating tank voltages $V_{T2}$, $V_{T3}$, $V_{T4}$ are delivered.

The particular tank configurations which each of the first, second, third and fourth tank circuits T1, T2, T3, T4 may have is dependent on whether the respective tank circuit is required to generate the respective oscillating tank voltage in-phase with, or leading by a phase of 90°, or lagging by a phase of 90°, or is 180° out-of-phase with, the respective first, second, third and fourth oscillating drive voltages $V_{D1}$, $V_{D2}$, $V_{D3}$, $V_{D4}$. In particular, where the first, second, third or fourth tank circuit T1, T2, T3, T4 is required to generate the respective first, second, third or fourth oscillating tank voltage $V_{T1}$, $V_{T2}$, $V_{T3}$, $V_{T4}$ having a phase that lags by 90° a phase of the respective first, second, third or fourth oscillating drive voltage, the first, second, third or fourth tank circuit T1, T2, T3, T4 may have the first tank configuration described with reference to FIG. 4. Where the first, second, third or fourth tank circuit T1, T2, T3, T4 is required to generate the respective first, second, third or fourth oscillating tank voltage $V_{T1}$, $V_{T2}$, $V_{T3}$, $V_{T4}$ having a phase that leads by 90° a phase of the respective first, second, third or fourth oscillating drive voltage, the first, second, third or fourth tank circuit T1, T2, T3, T4 may have the second tank configuration described with reference to FIG. 5. Where the first, second, third or fourth tank circuit T1, T2, T3, T4 is required to generate the respective first, second, third or fourth oscillating tank voltage $V_{T1}$, $V_{T2}$, $V_{T3}$, $V_{T4}$ in-phase with the respective first, second, third or fourth oscillating drive voltage $V_{D1}$, $V_{D2}$, $V_{D3}$, $V_{D4}$, the first, second, third or fourth tank circuit T1, T2, T3, T4 may have any of the third, fourth or fifth tank configuration, or their variants, described with reference to FIGS. 6, 7 and 8. Where the first, second, third or fourth tank circuit T1, T2, T3, T4 is required to generate the respective first, second, third or fourth oscillating tank voltage $V_{T1}$, $V_{T2}$, $V_{T3}$, $V_{T4}$ 180° out-of-phase with the respective first, second, third or fourth oscillating drive voltage $V_{D1}$, $V_{D2}$, $V_{D3}$, $V_{D4}$, the first, second, third or fourth tank circuit T1, T2, T3, T4 may have the modified version of any of the third, fourth or fifth tank configurations, or their variants, described with reference to FIGS. 6, 7 and 8.

Although the first to fifth tank configurations described with reference to FIGS. 4 to 8 have the same voltage rail 14, any or all of the first, second, third or fourth tank circuit T1, T2, T3, T4 may have different voltage rails providing different voltages.

Figure 9:
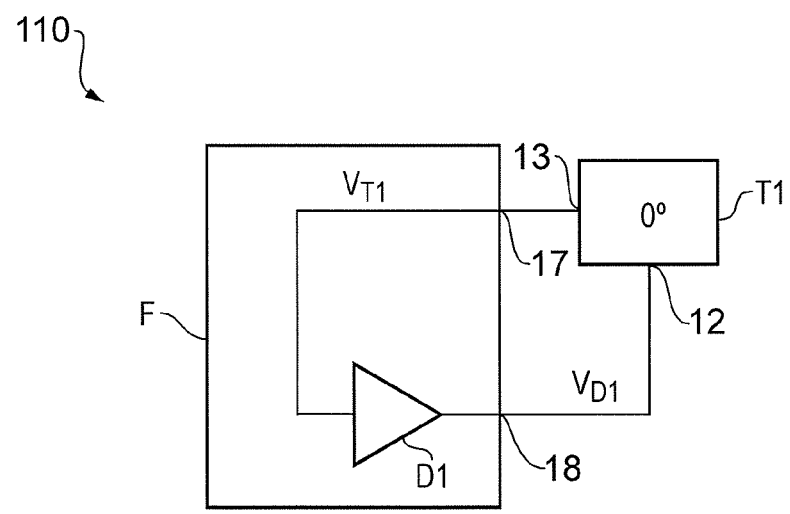
FIGS. 9 to 18 are schematic diagrams of oscillator circuits.

Referring to FIG. 9, in a first preferred embodiment, an oscillator circuit 110 comprises the first tank circuit T1 and the feedback stage F as described in relation to the oscillator circuit 100 of FIG. 3, the feedback stage F having a first feedback configuration in which the feedback stage F comprises a first driver D1 coupled in series between the input 17 of the feedback stage F and the output 18 of the feedback stage F. The first tank circuit T1 generates the first oscillating tank voltage $V_{T1}$ at the first tank output 13 in response to the first oscillating drive voltage $V_{D1}$ applied at the first drive node 12. The first tank output 13 is coupled to the input 17 of the feedback stage F, and the first drive node 12 is coupled to the output 18 of the feedback stage F. In the first preferred embodiment, the first tank circuit T1 generates the first oscillating tank voltage $V_{T1}$ in-phase with the first oscillating drive voltage $V_{D1}$, and therefore may have any of the third, fourth or fifth tank configurations, or their variants, described above with reference to FIG. 6, 7 or 8. The first driver D1 generates the first oscillating drive voltage $V_{D1}$ in response to, and in-phase with, the first oscillating tank voltage $V_{T1}$, so does not introduce any phase change, which is signified by "0°" in the Figures. The first driver D1 may have positive and negative input terminals, in other words, a differential input, coupled to the pair of terminals 13a, 13b of the first tank output 13.

In a variant of the oscillator circuit 110 described with reference to FIG. 9, the first tank circuit T1 generates the first oscillating tank voltage $V_{T1}$ 180° out-of-phase with the first oscillating drive voltage $V_{D1}$, and therefore may have any of the modified third, fourth or fifth tank configurations, or their variants, described above with reference to FIG. 6, 7 or 8, and the first driver D1 applies signal inversion to the first oscillating tank voltage $V_{T1}$, thereby introducing a phase change of 180°, such that the first oscillating drive voltage $V_{D1}$ is 180° out-of-phase with the first oscillating tank voltage $V_{T1}$, as required to sustain oscillation.

In some applications, an oscillator circuit is required that generates a differential or balanced oscillating signal, that is, generates a pair of signals where one signal, also referred to as a first signal component, is the inverse of the other signal, or second signal component.

Figure 10:
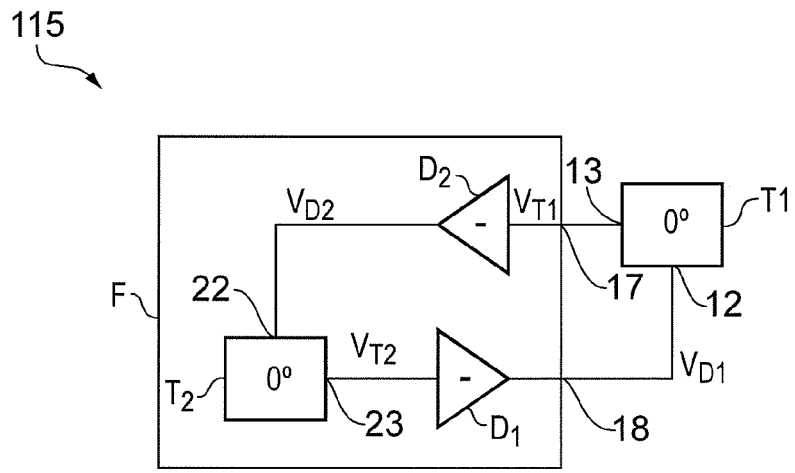

Referring to FIG. 10, in a second embodiment, an oscillator circuit 115 generates such a balanced oscillating signal, and comprises the first tank circuit T1 and the feedback stage F as described in relation to the oscillator circuit 100 of FIG. 3, the feedback stage F having a second feedback configuration. In the second feedback configuration, the feedback stage F comprises a second tank circuit T2 having a second drive node 22 for applying a second oscillating drive voltage $V_{D2}$ to the second tank circuit T2, and a second tank output 23 for delivering a second oscillating tank voltage $V_{T2}$ from the second tank circuit T2. The second tank output 23 is coupled to the output 18 of the feedback stage F via a first driver D1, and the second drive node 22 is coupled to the input 17 of the feedback stage F via a second driver D2. The first tank circuit T1 generates the first oscillating tank voltage $V_{T1}$ at the first tank output 13 in response to, and in-phase with, the first oscillating drive voltage $V_{D1}$ applied at the first drive node 12. The second driver D2 generates the second oscillating drive voltage $V_{D2}$ 180° out-of-phase with the first oscillating tank voltage $V_{T1}$ by applying signal inversion, or in other words inverting, the first oscillating tank voltage $V_{T1}$. The second tank circuit T2 generates a second oscillating tank voltage $V_{T2}$ at the second tank output 23 in response to, and in-phase with, the second oscillating drive voltage $V_{D2}$ applied at the second drive node 22. The first driver D1 generates the first oscillating drive voltage $V_{D1}$ 180° out-of-phase with the second oscillating tank voltage $V_{T2}$ by applying signal inversion the second oscillating tank voltage $V_{T2}$. Therefore, the first oscillating drive voltage $V_{D1}$ is generated in response to, and in-phase with, the first oscillating tank voltage $V_{T1}$, as required to sustain oscillation. The second oscillating tank voltage $V_{T2}$ is 180° out-of-phase with respect to the first oscillating tank voltage $V_{T1}$, and consequently the first and second oscillating tank voltages $V_{T1}$, $V_{T2}$ are available to be used as first and seconds signal components of a balanced oscillating signal.

In a first variant of the oscillator circuit 115 described with reference to FIG. 10, the first tank circuit T1 generates the first oscillating tank voltage $V_{T1}$ 180° out-of-phase with the first oscillating drive voltage $V_{D1}$, and the second driver D2 does not apply signal inversion to the first oscillating tank voltage $V_{T1}$, such that the first oscillating drive voltage $V_{D1}$ is 180° out-of-phase with the first oscillating tank voltage $V_{T1}$.

In a second variant of the oscillator circuit 115 described with reference to FIG. 10, the first tank circuit T1 generates the first oscillating tank voltage $V_{T1}$ 180° out-of-phase with the first oscillating drive voltage $V_{D1}$, the second driver D2 does not apply signal inversion to the first oscillating tank voltage $V_{T1}$, whereby the second oscillating drive voltage $V_{D2}$ is in-phase with the first oscillating tank voltage $V_{T1}$, the second tank circuit T2 generates the second oscillating tank voltage $V_{T2}$ 180° out-of-phase with the second oscillating drive voltage $V_{D2}$, and the first driver does not apply signal inversion to the second oscillating tank voltage $V_{T2}$, with the result that the first oscillating drive voltage $V_{D1}$ is 180° out-of-phase with the first oscillating tank voltage $V_{T1}$. Therefore, the second oscillating tank voltage $V_{T2}$ is 180° out-of-phase with respect to the first oscillating tank voltage $V_{T1}$, and consequently the first and second oscillating tank voltages $V_{T1}$, $V_{T2}$ may be used as first and second signal components of a balanced oscillating signal.

In some applications, an oscillator circuit is required that generates a pair of oscillating signals that have a quadrature relationship, that is, differ in phase by 90°. Such an oscillator circuit has application in, for example, local oscillator signal generation in wireless communication apparatus. For the oscillator circuit 115, and its first and second variants, described with reference to FIG. 10, the phase relationship of the first and second oscillating tank voltages $V_{T1}$, $V_{T2}$ has been described, as this phase relationship is relevant to ensuring positive feedback to sustain oscillation, and also as these oscillating voltages may be used by an external apparatus. Alternatively, external apparatus may employ oscillating voltages generated at other locations in the respective first and second tank circuits T1, T2, and such oscillating voltages may have a different phase than that of the first and second oscillating tank voltages $V_{T1}$, $V_{T2}$. For example, where the first and second tank circuits T1, T2 have any of the tank configurations described with reference to FIGS. 6, 7 and 8, an external apparatus may employ an oscillating voltage generated at the following locations: in tank configuration of FIGS. 6 and 7, a junction 15 between the capacitive element C and the sensor S, or a junction 19 between the inductive element L and the sensor S; in the tank configuration of FIG. 8, the junction 11 between the capacitive element and the inductive element. Therefore, depending on the choice of tank configurations and their variants, which need not be the same for both the first and second tank circuits T1, T2, external apparatus may employ oscillating voltages that lead or lag the first and second oscillating tank voltages $V_{T1}$, $V_{T2}$ by 90°, and, in particular, oscillating voltages having a quadrature relationship may be provided.

Figure 11:
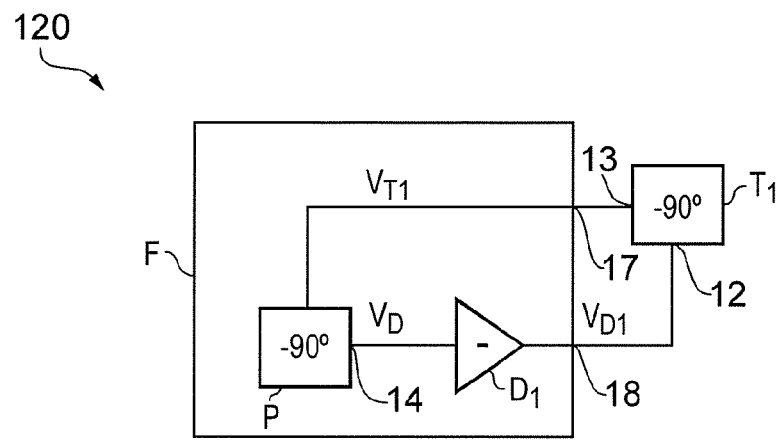

Referring to FIG. 11, in a third embodiment, an oscillator circuit 120 comprises the first tank circuit T1 and the feedback stage F as described in relation to the oscillator circuit 100 of FIG. 3, the feedback stage F having a third feedback configuration. The first tank circuit T1 generates at the first tank output 13, in response to the first oscillating drive voltage $V_{D1}$ present at the first tank input 12, the first oscillating tank voltage $V_{T1}$ having a phase lagging a phase of the first oscillating drive voltage $V_{D1}$ by 90°. In the third feedback configuration, the feedback stage F comprises a phase shift stage P arranged for applying a phase lag of 90°, and a first driver D1. The phase shift stage P is coupled to the input 17 of the feedback stage F for receiving the first oscillating tank voltage $V_{T1}$ from the first tank circuit T1. The phase shift stage P generates, at an output 14 of the phase shift stage P, and responsive to the first oscillating tank voltage $V_{T1}$, a first intermediate oscillating voltage $V_{I1}$ having a phase lagging by 90° a phase of the first oscillating tank voltage $V_{T1}$. The output 14 of the phase shift stage P is coupled to the output 18 of the feedback stage F via the first driver D1 which generates, responsive to the first oscillating intermediate voltage $V_{I1}$, the first oscillating drive voltage $V_{D1}$ by applying signal inversion to the first intermediate oscillating voltage $V_{I1}$. Due to the 90° phase shift provided by the first tank circuit T1, the 90° phase shift provided by the phase shift stage P, and the inversion provided by the first driver D1, corresponding to a phase shift of 180°, the first oscillating drive voltage $V_{D1}$ has a phase that leads the phase of the first oscillating tank voltage $V_{T1}$ by 90°, as required to sustain oscillation. The first oscillating tank voltage $V_{T1}$ and the first intermediate oscillating voltage $V_{I1}$ differ in phase by 90°, and therefore are available as quadrature-related oscillating signals.

Figure 12:
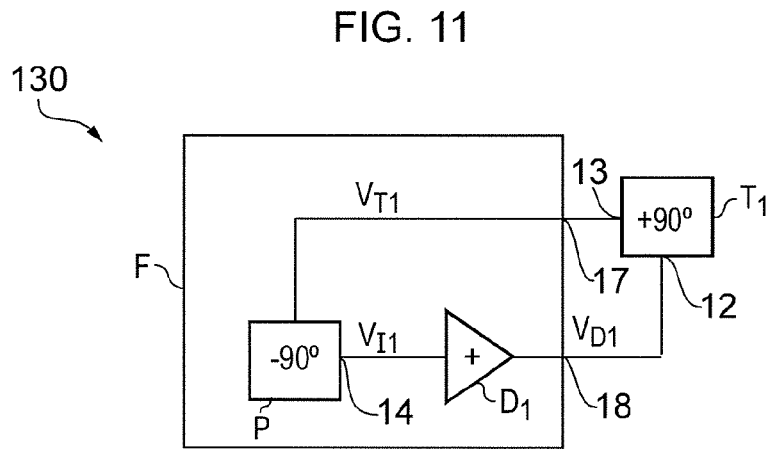

Referring to FIG. 12, in a fourth embodiment, an oscillator circuit 130 is identical to the third embodiment described with reference to FIG. 11, except that the first tank circuit T1 is arranged to generate at the first tank output 13, in response to the first oscillating drive voltage $V_{D1}$ present at the first tank input 12, the first oscillating tank voltage $V_{T1}$ having a phase leading a phase of the first oscillating drive voltage $V_{D1}$ by 90°, and the first driver D1 does not apply signal inversion but generates, responsive to the first oscillating intermediate voltage $V_{I1}$, the first oscillating drive voltage $V_{D1}$ in-phase with the first intermediate oscillating voltage $V_{I1}$, with the result that the first oscillating drive voltage $V_{D1}$ has a phase that leads the phase of the first oscillating tank voltage $V_{T1}$ by 90°, as required to sustain oscillation. The first oscillating tank voltage $V_{T1}$ and the first intermediate oscillating voltage $V_{I1}$ differ in phase by 90°, and therefore are available as quadrature-related oscillating signals.

Figure 13:
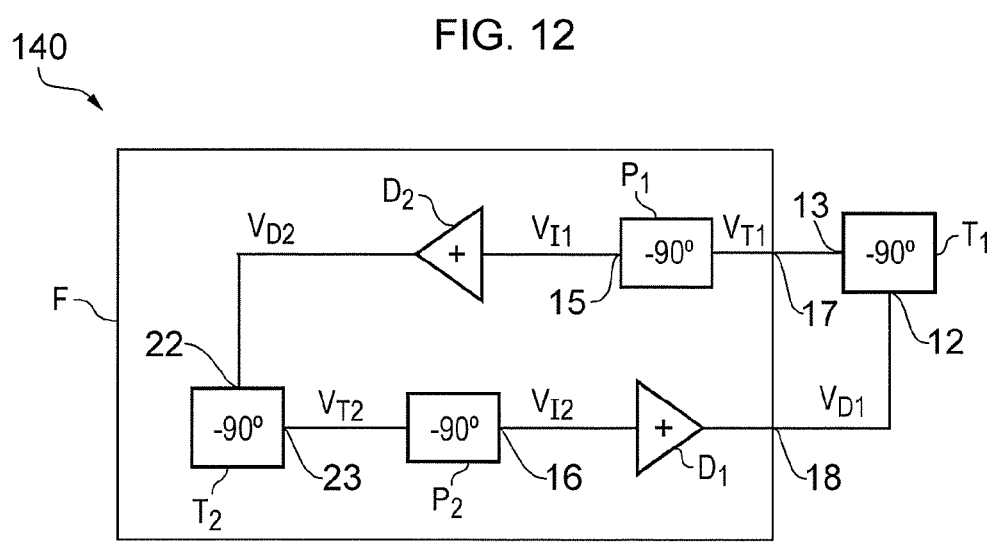

Referring to FIG. 13, a fifth embodiment, an oscillator circuit 140 comprises the first tank circuit T1 and the feedback stage F as described in relation to the oscillator circuit 100 of FIG. 3, the feedback stage F having a fourth feedback configuration. The first tank circuit T1 generates at the first tank output 13, in response to the first oscillating drive voltage $V_{D1}$ present at the first tank input 12, the first oscillating tank voltage $V_{T1}$ having a phase lagging a phase of the first oscillating drive voltage $V_{D1}$ by 90°. In the third feedback configuration, the feedback stage F comprises a first phase shift circuit P1, a second phase shift circuit P2, a first driver D1, a second driver D2, and a second tank circuit T2. The first phase shift circuit P1 is coupled to the input 17 of the feedback stage F, and generates at an output 15 of the first phase shift circuit P1, responsive to the first oscillating tank voltage $V_{T1}$, a first intermediate oscillating voltage $V_{I1}$ have a phase that lags the phase of the first oscillating tank voltage $V_{T1}$ by 90°. The output 15 of the first phase shift circuit P1 is coupled to a second drive node 22 of the second tank circuit T2 via the second driver D2 which generates, responsive to the first intermediate oscillating voltage $V_{I1}$, a second oscillating drive voltage $V_{D2}$ in-phase with the first intermediate oscillating voltage $V_{I1}$. The second oscillating drive voltage $V_{D2}$ is delivered to the second drive node 22. The second tank circuit T2 generates at a second tank output 23, in response to the second oscillating drive voltage $V_{D2}$, a second oscillating tank voltage $V_{T2}$ having a phase lagging a phase of the second oscillating drive voltage $V_{D2}$ by 90°. The second phase shift circuit P2 is coupled to the second tank output 23 of the second tank circuit T2, and generates at an output 16 of the second phase shift circuit P2, responsive to the second oscillating tank voltage $V_{T2}$, a second intermediate oscillating voltage $V_{I2}$ having a phase that lags the phase of the second oscillating tank voltage $V_{T2}$ by 90°.

The output 16 of the second phase shift circuit P2 is coupled to the output 18 of the feedback stage F via the first driver D1 which generates, responsive to the second intermediate oscillating voltage $V_{I2}$, the first oscillating drive voltage $V_{D1}$ in-phase with the second intermediate oscillating voltage $V_{I2}$. The first and second oscillating tank voltages $V_{T1}$, $V_{T2}$ differ in phase by 180°, and so may be used as first and second signal components of a balanced oscillating signal. The first oscillating drive voltage $V_{D1}$ delivered from the output 18 of the feedback stage F has a phase that lags the phase of the first oscillating tank voltage $V_{T1}$ by 270°, or equivalently leads the phase of the first oscillating tank voltage $V_{T1}$ by 90°, as required to sustain oscillation.

Figure 14:
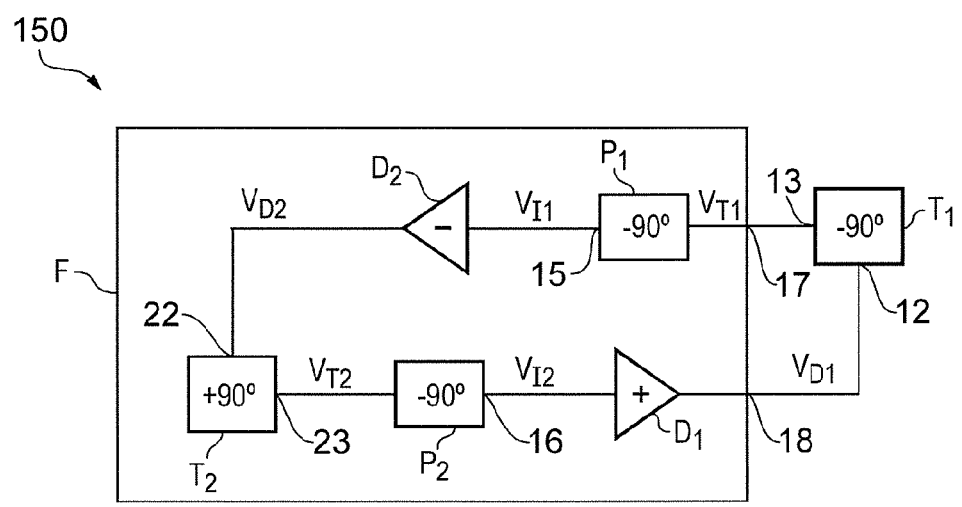

Referring to FIG. 14, in a sixth embodiment, an oscillator circuit 150 is identical to the fifth embodiment described with reference to FIG. 13, except that the second driver D2 applies signal inversion to the first oscillating intermediate voltage $V_{I1}$, such that the second oscillating drive $V_{D2}$ generated by the second driver D2 is 180° out-of-phase with respect to the first oscillating intermediate voltage $V_{I1}$, and second tank circuit T2 is arranged to generate at the second tank output 23, in response to the second oscillating drive voltage $V_{D2}$ present at the second tank input 22, the second oscillating tank voltage $V_{T2}$ having a phase that lags a phase of the second oscillating drive voltage $V_{D2}$ by 90°. Consequently, the first and second oscillating tank voltages $V_{T1}$, $V_{T2}$ differ in phase by 180°, and so may be used as first and second signal components of a balanced oscillating signal, and the first oscillating drive voltage $V_{D1}$ has a phase that leads the phase of the first oscillating tank voltage $V_{T1}$ by 90°, as required to sustain oscillation.

Figure 15:
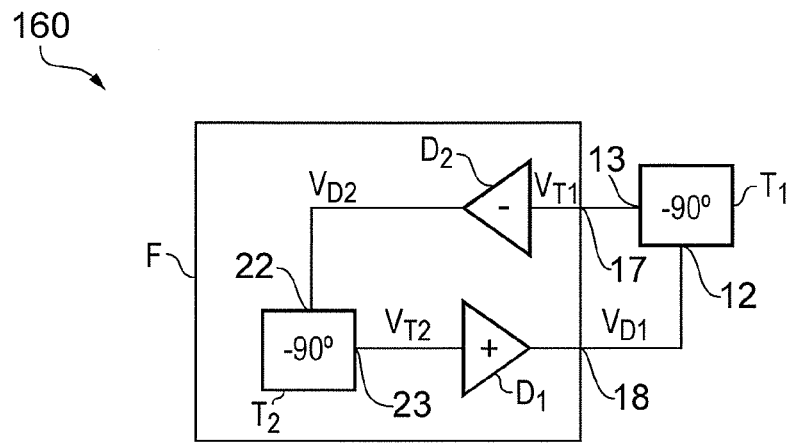

Referring to FIG. 15, in a seventh embodiment, an oscillator circuit 160 generates a pair of signals that have a quadrature relationship, and comprises the first tank circuit T1 and the feedback stage F as described in relation to the oscillator circuit 100 of FIG. 3, the feedback stage F having a fifth feedback configuration. The first tank circuit T1 generates the first oscillating tank voltage $V_{T1}$ at the first tank output 13 in response to, the first oscillating drive voltage $V_{D1}$ applied at the first drive node 12, and having a phase that lags a phase of the first oscillating drive voltage $V_{D1}$ by 90°. In the fifth feedback configuration, the feedback stage F comprises a second tank circuit T2 having a second drive node 22 for applying a second oscillating drive voltage $V_{D2}$ to the second tank circuit T2, and a second tank output 23 for delivering a second oscillating tank voltage $V_{T2}$ from the second tank circuit T2. The second tank output 23 is coupled to the output 18 of the feedback stage F via a first driver D1, and the second drive node 22 is coupled to the input 17 of the feedback stage F via a second driver D2. The second driver D2 generates the second oscillating drive voltage $V_{D2}$ 180° out-of-phase with the first oscillating tank voltage $V_{T1}$ by applying signal inversion the first oscillating tank voltage $V_{T1}$. The second tank circuit T2 generates a second oscillating tank voltage $V_{T2}$ at the second tank output 23 in response to the second oscillating drive voltage $V_{D2}$ applied at the second drive node 22, and having a phase that lags a phase of the second oscillating drive voltage $V_{D2}$ by 90°. The first driver D1 generates the first oscillating drive voltage $V_{D1}$ in response to, and in-phase with, the second oscillating tank voltage $V_{T2}$. Therefore, the first oscillating drive voltage $V_{D1}$ is generated in response to, and in-phase with, the first oscillating tank voltage $V_{T1}$, as required to sustain oscillation. The second oscillating tank voltage $V_{T2}$ is 180° out-of-phase with respect to the first oscillating tank voltage $V_{T1}$, and consequently the first and second oscillating tank voltages $V_{T1}$, $V_{T2}$ are available to be used as first and seconds signal components of a balanced oscillating signal.

Figure 16:
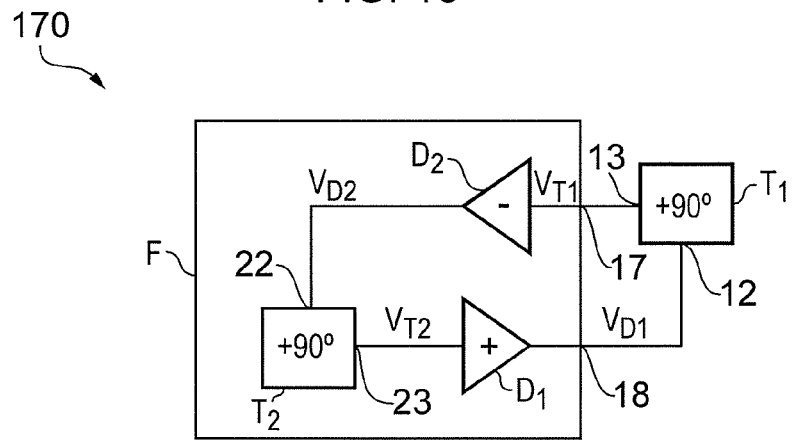

Referring to FIG. 16, in an eighth embodiment, an oscillator circuit 170 is identical to the seventh embodiment described with reference to FIG. 15, except that the first tank circuit T1 generates the first oscillating tank voltage $V_{T1}$ having a phase that leads a phase of the first oscillating drive voltage $V_{D1}$ by 90°, and the second tank circuit T2 generates a second oscillating tank voltage $V_{T2}$ having a phase that leads a phase of the second oscillating drive voltage $V_{D2}$ by 90°. Therefore, the first and second oscillating tank voltages $V_{T1}$, $V_{T2}$ differ in phase by 90°, so have a quadrature relationship, and the first oscillating drive voltage $V_{D1}$ has a phase that lags the phase of the first oscillating tank voltage $V_{T1}$ by 90°, as required to sustain oscillation.

Figure 17:
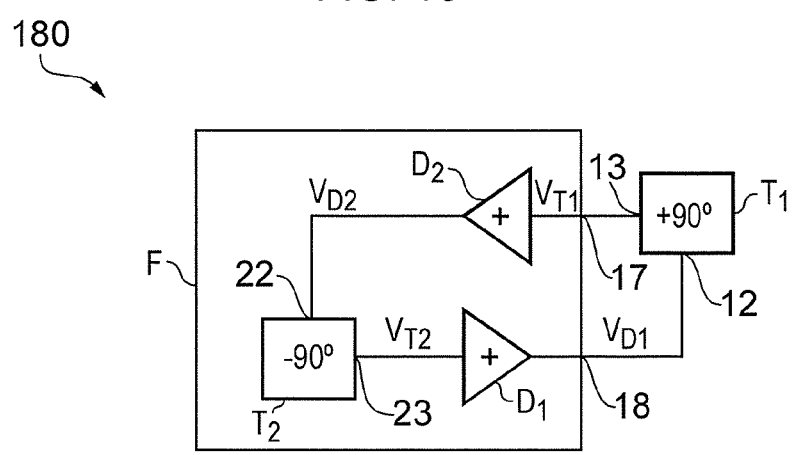

Referring to FIG. 17, in a ninth embodiment, an oscillator circuit 180 is identical to the seventh embodiment described with reference to FIG. 15, except that the first tank circuit T1 generates the first oscillating tank voltage $V_{T1}$ having a phase that leads a phase of the first oscillating drive voltage $V_{D1}$ by 90°, and the second driver D2 does not apply signal inversion, such that the second oscillating drive voltage $V_{D2}$ is in-phase with the first oscillating tank voltage $V_{T1}$. Again, the first and second oscillating tank voltages $V_{T1}$, $V_{T2}$ differ in phase by 90°, so have a quadrature relationship, and the first oscillating drive voltage $V_{D1}$ has a phase that lags the phase of the first oscillating tank voltage $V_{T1}$ by 90°, as required to sustain oscillation.

In some applications, an oscillator circuit is required that generates a pair of signals that have a quadrature relationship, that is, differ in phase by 90°, and where both of the signals are required to be balanced, both having first and second signal components. In this case, four signal components are required having phases 0°, 90°, 180° and 270°. Such an oscillator circuit has application in, for example, local oscillator signal generation in wireless communication apparatus.

Figure 18:
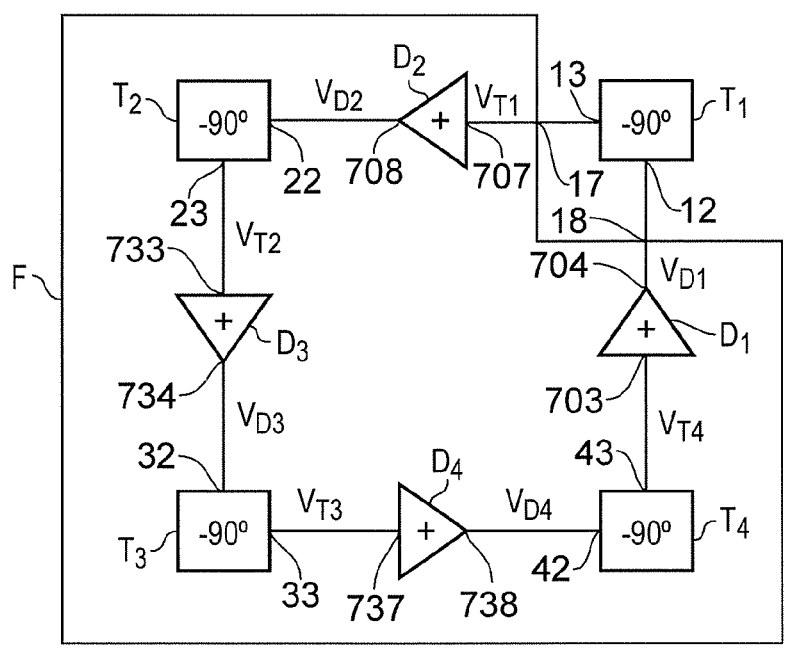

Referring to FIG. 18, in a tenth embodiment, an oscillator circuit 190 generates balanced quadrature-related oscillating signals, and comprises the first tank circuit T1 and the feedback stage F as described in relation to the oscillator circuit 100 of FIG. 3, the feedback stage F having a sixth feedback configuration. The first tank circuit T1 generates the first oscillating tank voltage $V_{T1}$ at the first tank output 13 in response to, the first oscillating drive voltage $V_{D1}$ applied at the first drive node 12, and having a phase that lags a phase of the first oscillating drive voltage $V_{D1}$ by 90°. In the sixth feedback configuration, the feedback stage F comprises a second tank circuit T2 having a second drive node 22 for applying a second oscillating drive voltage $V_{D2}$ to the second tank circuit T2 and a second tank output 23 for delivering a second oscillating tank voltage $V_{T2}$ from the second tank circuit T2, a third tank circuit T3 having a third drive node 32 for applying a third oscillating drive voltage $V_{D3}$ to the third tank circuit T3 and a third tank output 33 for delivering a third oscillating tank voltage $V_{T3}$ from the third tank circuit T3, and a fourth tank circuit T4 having a fourth drive node 42 for applying a fourth oscillating drive voltage $V_{D4}$ to the fourth tank circuit T4, and a fourth tank output 43 for delivering a fourth oscillating tank voltage $V_{T4}$ from the fourth tank circuit T4. The feedback stage F also comprises a first driver D1 having an input 703 coupled to the fourth tank output 43 and an output 704 coupled to the output 18 of the feedback stage F and thereby to the first drive node 12, a second driver D2 having an input 707 coupled to the input 17 of the feedback stage F and thereby to the first tank output 13, and an output 708 coupled to the second drive node 22, a third driver D3 having an input 733 coupled to the second tank output 23 and an output 734 coupled to the third drive node 32, and a fourth driver D4 having an input 737 coupled to the third tank output 33 and an output 738 coupled to the fourth drive node 42. The first driver D1 generates the first oscillating drive voltage $V_{D1}$ responsive to, and in-phase with, the fourth oscillating tank voltage $V_{T4}$. The second driver D2 generates the second oscillating drive voltage $V_{D2}$ responsive to, and in-phase with, the first oscillating tank voltage $V_{T1}$. The third driver D3 generates the third oscillating drive voltage $V_{D3}$ responsive to, and in-phase with, the second oscillating tank voltage $V_{T2}$. The fourth driver D4 generates the fourth oscillating drive voltage $V_{D4}$ responsive to, and in-phase with, the third oscillating tank voltage $V_{T3}$. The second oscillating tank voltage $V_{T2}$ has a phase that lags the phase of the first oscillating tank voltage $V_{T1}$ by 90°, the third oscillating tank voltage $V_{T3}$ has a phase that lags the phase of the second oscillating tank voltage $V_{T2}$ by 90°, and the fourth oscillating tank voltage $V_{T4}$ has a phase that lags the phase of the third oscillating tank voltage $V_{T3}$ by 90°, thereby providing two quadrature-related balanced oscillating signals. The first oscillating drive voltage $V_{D1}$ leads the first oscillating tank voltage $V_{T1}$ by 90°, as required to sustain oscillation.

A first variant of the oscillator circuit 190 described with reference to FIG. 18 differs from the oscillator circuit 190 in that each of the first, second, third and fourth drivers D1, D2, D3, D4 provide signal inversion, such that the second oscillating drive voltage $V_{D2}$ is 180° out-of-phase with the first oscillating tank voltage $V_{T1}$, the third oscillating drive voltage $V_{D3}$ is 180° out-of-phase with the second oscillating tank voltage $V_{T2}$, the fourth oscillating drive voltage $V_{D4}$ is 180° out-of-phase with the third oscillating tank voltage $V_{T3}$, and the first oscillating drive voltage $V_{D1}$ is 180° out-of-phase with the fourth oscillating tank voltage $V_{T4}$.

A second variant of the oscillator circuit 190 described with reference to FIG. 18 differs from the oscillator 190 in that the first tank circuit T1 generates the first oscillating tank voltage $V_{T1}$ having a phase that leads the phase of the first oscillating drive voltage $V_{D1}$ by 90°, the second tank circuit T2 generates the second oscillating tank voltage $V_{T2}$ having a phase that leads the phase of the second oscillating drive voltage $V_{D2}$ by 90°, the third tank circuit T3 generates the third oscillating tank voltage $V_{T3}$ having a phase that leads the phase of the third oscillating drive voltage $V_{D3}$ by 90°, and the fourth tank circuit T4 generates the fourth oscillating tank voltage $V_{T4}$ having a phase that leads the phase of the fourth oscillating drive voltage $V_{D4}$ by 90°.

A third variant of the oscillator circuit 190 described with reference to FIG. 18 differs from the oscillator circuit 190 in that each of the first, second, third and fourth drivers D1, D2, D3, D4 provide signal inversion, such that the second oscillating drive voltage $V_{D2}$ is 180° out-of-phase with the first oscillating tank voltage $V_{T1}$, the third oscillating drive voltage $V_{D3}$ is 180° out-of-phase with the second oscillating tank voltage $V_{T2}$, the fourth oscillating drive voltage $V_{D4}$ is 180° out-of-phase with the third oscillating tank voltage $V_{T3}$, and the first oscillating drive voltage $V_{D1}$ is 180° out-of-phase with the fourth oscillating tank voltage $V_{T4}$. In addition, the first tank circuit T1 generates the first oscillating tank voltage $V_{T1}$ having a phase that leads the phase of the first oscillating drive voltage $V_{D1}$ by 90°, the second tank circuit T2 generates the second oscillating tank voltage $V_{T2}$ having a phase that leads the phase of the second oscillating drive voltage $V_{D2}$ by 90°, the third tank circuit T3 generates the third oscillating tank voltage $V_{T3}$ having a phase that leads the phase of the third oscillating drive voltage $V_{D3}$ by 90°, and the fourth tank circuit T4 generates the fourth oscillating tank voltage $V_{T4}$ having a phase that leads the phase of the fourth oscillating drive voltage $V_{D4}$ by 90°.

Each of the first, second and third variants of the oscillator circuit 190 described with reference to FIG. 18 generates balanced quadrature-related oscillating signals.

Figure 19:
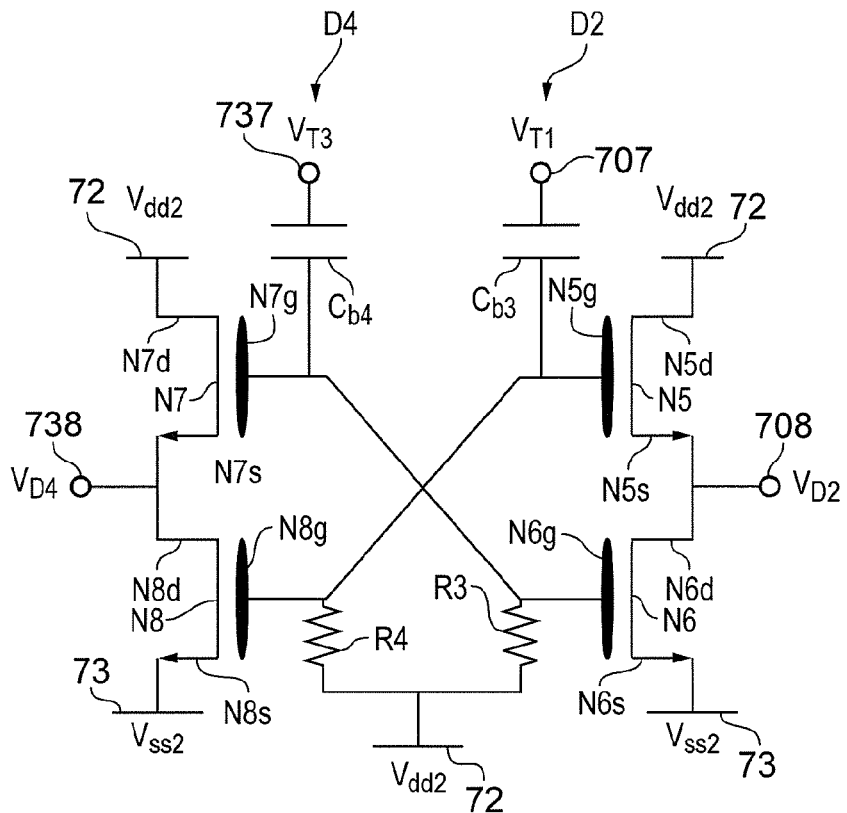
FIG. 19 is a schematic diagram of drivers.
Figure 19:
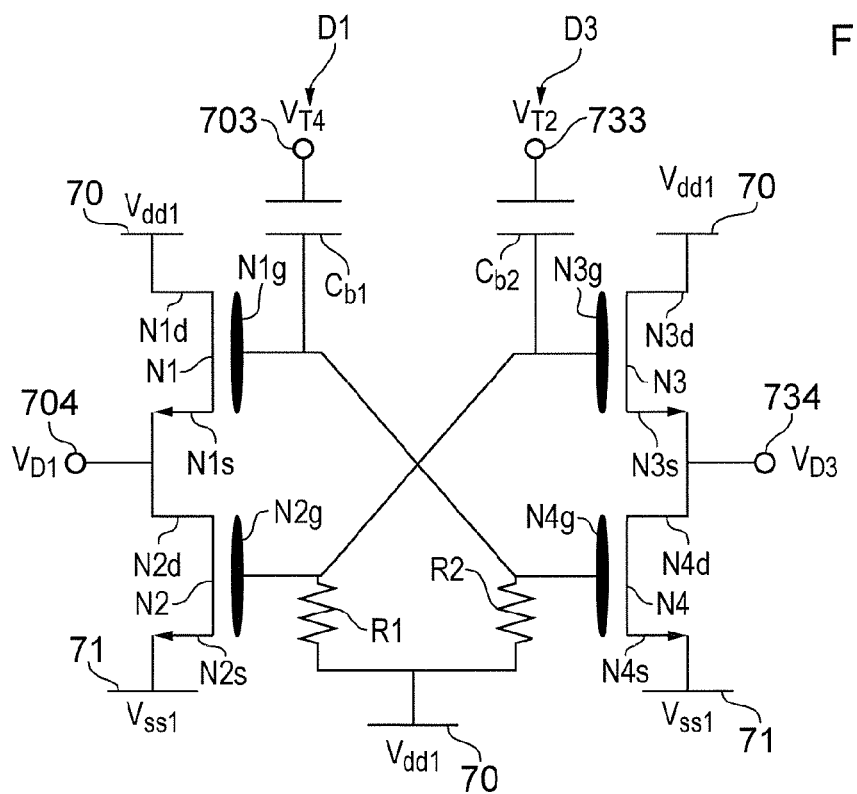

Referring to FIG. 19, there is illustrated a preferred embodiment of the first, second, third and fourth drivers D1, D2, D3, D4 of the oscillator circuit 190 illustrated in, and described with reference to, FIG. 18. The first driver D1 comprises first and second transistors N1, N2 which are n-channel CMOS transistors. The first transistor N1 has a drain N1d coupled to a first power supply rail 70 supplying a power supply voltage $V_{dd1}$, a gate N1g coupled to the input 703 of the first driver D1 by a first coupling capacitor $C_{b1}$, and a source N1s coupled to the output 704 of the first driver D1. The second transistor N2 has a drain N2d coupled to the output 704 of the first driver D1, a source coupled to a second power supply rail 71 supplying a power supply voltage $V_{ss1}$, and a gate N2g coupled to the first power supply rail 70 by a first resistor R1 for biasing. The third driver D3 comprises third and fourth transistors N3, N4 which are n-channel CMOS transistors. The third transistor N3 has a drain N3g coupled to the first power supply rail 70, a gate N3g coupled to the third driver D3. The fourth transistor N4 has a drain N4d coupled to the output 734 of the first driver D1, a source N4s coupled to the second power supply rail 71, and a gate N4g coupled to the first power supply rail 70 by a second resistor R2 for biasing.

Continuing to refer to FIG. 19, the second driver D2 comprises fifth and sixth transistors N5, N6 which are n-channel CMOS transistors. The fifth transistor N5 has a drain N5d coupled to a third power supply rail 72 supplying a power supply voltage $V_{dd2}$, which may be the same as the power supply voltage $V_{dd1}$, a gate N5g coupled to the input 707 of the second driver D2 by a third coupling capacitor $C_{b3}$, and a source N5s coupled to the output 708 of the second driver D2. The sixth transistor N6 has a drain N6d coupled to the output 708 of the second driver D2, a source coupled to a fourth power supply rail 73 supplying a power supply voltage $V_{ss2}$, which may be the same as the power supply voltage $V_{ss1}$, and a gate N6g coupled to the third power supply rail 72 by a third resistor R3 for biasing. The fourth driver D4 comprises seventh and eighth transistors N7, N8 which are n-channel CMOS transistors. The seventh transistor N7 has a drain N7g coupled to the second power supply rail 72, a gate N7g coupled to the input 737 of the fourth driver D4, and a source N7s coupled to the output 738 of the fourth driver D4. The eighth transistor N8 has a drain N8d coupled to the output 738 of the fourth driver D4, a source N8s coupled to the fourth power supply rail 73, and a gate N8g coupled to the third power supply rail 72 by a fourth resistor R4 for biasing.

The first coupling capacitor $C_{b1}$, in conjunction with non-illustrated parasitic capacitances of the gates N1g and N4g of, respectively, the first and fourth transistors N1, N4, form a capacitive voltage divider to reduce the amplitude of the voltage applied, in response to the fourth oscillating tank voltage $V_{T4}$ present at the input 703 of the first driver D1, to the gates N1g and N4g of, respectively, the first and fourth transistors N1, N4 to a tolerable value. Likewise, the second coupling capacitor $C_{b1}$, in conjunction with non-illustrated parasitic capacitances of the gates N2g and N3g of, respectively, the second and third transistors N2, N3, form a capacitive voltage divider to reduce the amplitude of the voltage applied, in response to the second oscillating tank voltage $V_{T2}$ present at the input 733 of the third driver D3, to the gates N2g and N3g of, respectively, the second and third transistors N2, N3 to a tolerable value. Similarly, the third and fourth coupling capacitors $C_{b3}$, $C_{b4}$ perform a corresponding role to reduce the amplitude of the voltages applied to the gates N5g, N6g, N7g, N8g of the fifth, sixth, seventh and eighth transistors N5, N6, N7, N8.

In those described embodiments of the oscillator circuit which comprise more than one tank circuit, the tank circuits have an equal, or substantially the same, resonance frequency, for example within 5%. This contributes to high power efficiency. In particular, their respective inductive elements may have an equal, or substantially the same, inductance, and their respective capacitive elements may have an equal, or substantially the same, capacitance.

Each of the first, second, third and fourth drivers D1, D2, D3, D4 may be linear or non-linear amplifiers, but preferably, for high power efficiency, are arranged to switch, dependent on the voltage at their respective inputs relative to a threshold, alternatively between two different voltage levels, which typically are power supply voltages. Therefore, the respective first, second, third and fourth oscillating drive voltages $V_{D1}$, $V_{D2}$, $V_{D3}$, $V_{D4}$ may have a square or rectangular waveform, or an approximately square or rectangular waveform having finite rise and fall times. The first, second, third and fourth drivers D1, D2, D3, D4 are arranged to deliver power to the respective first, second, third and fourth tank circuits T1, T2, T3, T4 in order to sustain oscillation. Although embodiments of the first, second, third and fourth drivers D1, D2, D3, D4 have been described with reference to FIG. 19 in relation to the oscillator circuit 190 described with reference to FIG. 18, and its variants, these embodiments may be employed also in other of the disclosed oscillator circuits. Moreover, although embodiments of the first, second, third and fourth drivers D1, D2, D3, D4 have been described which comprise solely n-channel CMOS transistors, this is not essential, and variants comprising p-channel CMOS transistors and n-channel CMOS transistors may be employed instead.

Figure 20:
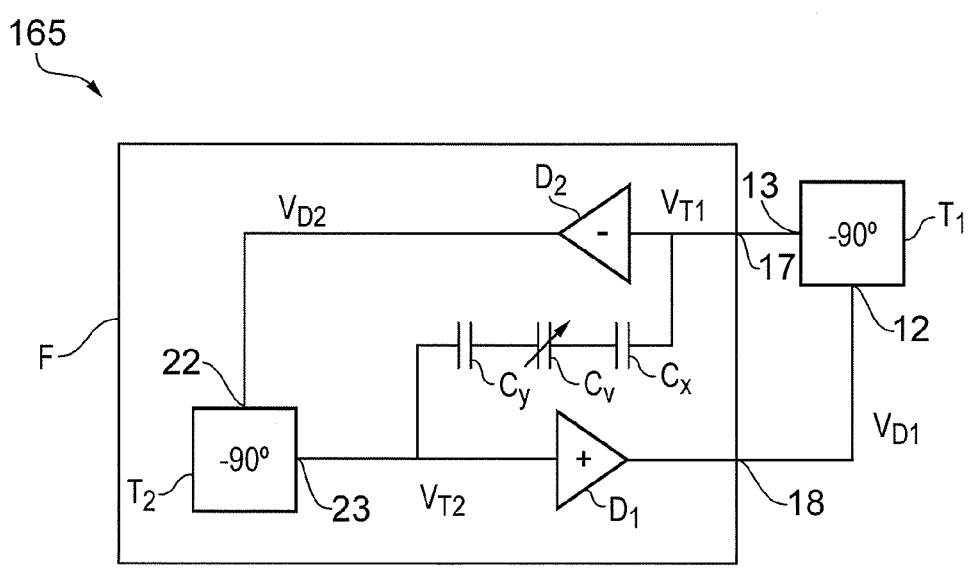
FIG. 20 is a schematic diagram of an oscillator circuit having provision for tuning.

Optionally, provision for tuning the frequency of oscillation may be added to the disclosed oscillator circuits. For example, FIG. 20 illustrates the oscillator circuit 160 described with reference to FIG. 15, but with additional provision for tuning comprising a variable capacitance element $C_V$ coupled to the first tank output 13 via a first additional capacitor $C_x$, and coupled to the second tank output 23 via a second additional capacitor $C_y$. The first and second additional capacitors $C_x$, $C_y$ are included to attenuate the first and second oscillating tank voltages $V_{T1}$, $V_{T2}$ applied to the variable capacitance element $C_V$ to a value that is tolerable by the variable capacitance element $C_V$. Depending on the voltage level that can be tolerated by the variable capacitance element $C_V$, the first and second additional capacitors $C_x$, $C_y$ may be omitted, with the variable capacitance element $C_V$ instead being coupled directly to the first and second tank outputs 13, 23 respectively. Typically, a frequency tuning range of about 10% may be provided by the variable capacitance element $C_V$.

Figure 21:
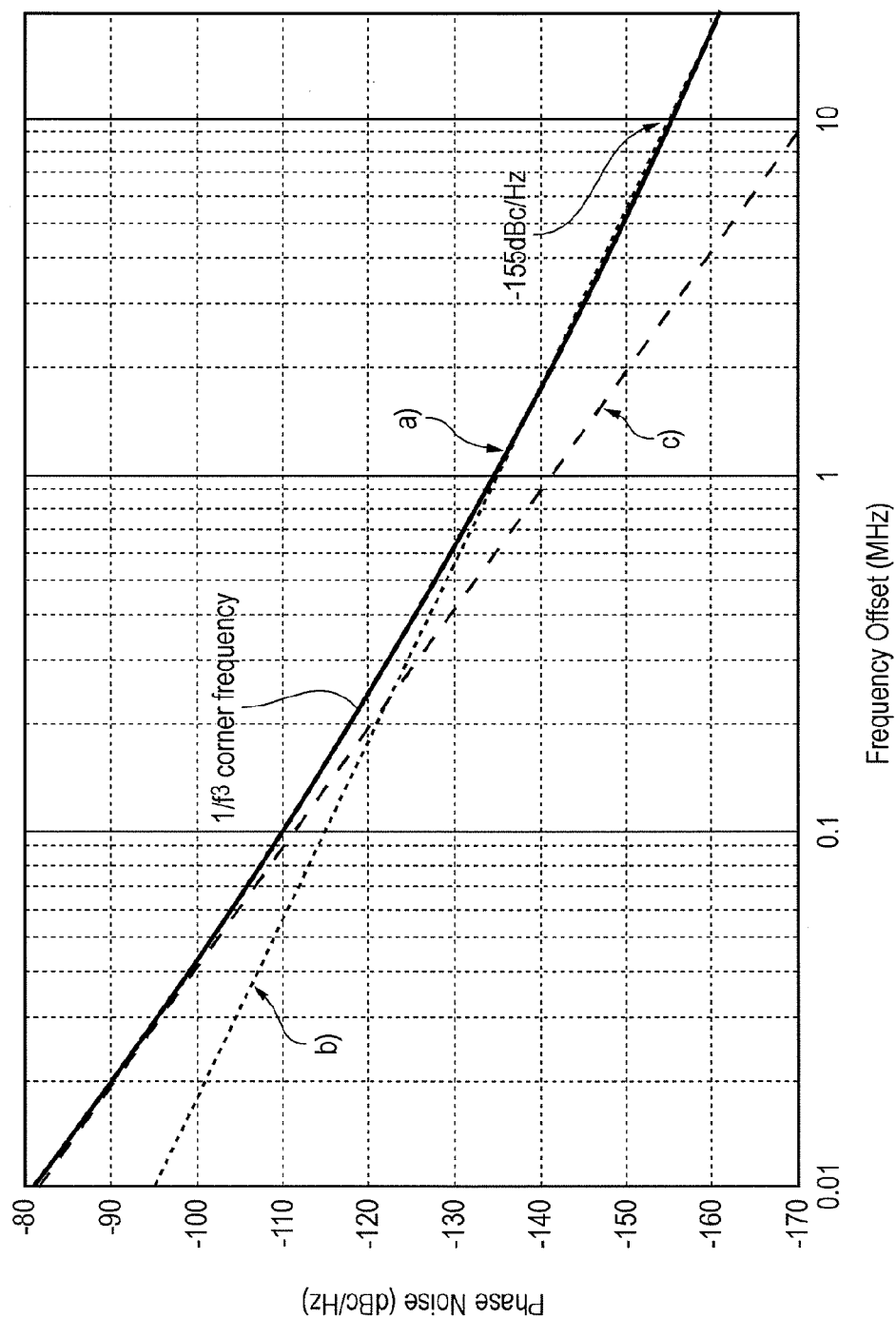
FIG. 21 is a graph of phase noise as a function of frequency for the oscillator circuit described with reference to FIG. 18.

FIG. 21 illustrates the phase noise of the oscillator circuit 190 described with reference to FIG. 18, as a function of frequency offset from the oscillation frequency, for the case where the inductive element of each of the first, second, third and fourth tank circuits T1, T2, T3, T4 has an inductance of 0.5 nH, the oscillator circuit 190 is arranged to oscillate at an oscillation frequency of 6 GHz, the voltage rail 14 of each of the first, second, third and fourth tank circuits T1, T2, T3, T4 provides 0.6V, and the oscillator circuit 190 draws a current of 110 mA. Graph a) in FIG. 21 represents the total phase noise, graph b) represents the contribution of thermal noise to the total phase noise, and graph c) represents the contribution of flicker noise to the total phase noise. Despite the low supply voltage, a very low phase noise is obtained, for example, −150 dBc/Hz at 10 MHz offset from the oscillation frequency. Such a low phase noise level would require a much larger capacitance and a much lower inductance in a parallel-resonance oscillator, resulting in a much less robust design.

Figure 22:
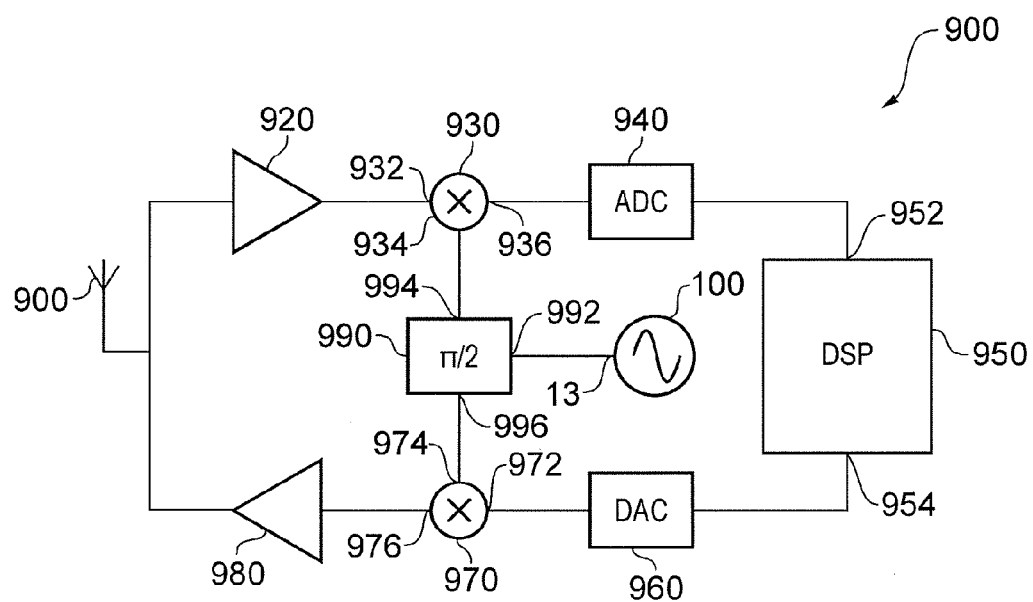
FIG. 22 is a schematic diagram of a wireless communication apparatus.

Referring to FIG. 22, a wireless communication device 900, such as a mobile phone, comprises an antenna 910 coupled to an input of a low noise amplifier 920 for amplifying a radio frequency (RF) signal received by the antenna 910. An output of the low noise amplifier 920 is coupled to a first input 932 of a down-conversion stage 930 for down-converting the amplified RF signal to baseband by mixing the amplified RF signal with quadrature-related components of a local oscillator signal present at a second input 934 of the down-conversion stage 930. An output 936 of the down-conversion stage 930 is coupled to an input 952 of a digital signal processor (DSP) 950 via an analogue-to-digital converter (ADC) 940 that digitises the baseband signal. The DSP 950 demodulates and decodes the digitised baseband signal. The DSP 950 also generates, at an output 954 of the DSP 950, a baseband signal to be transmitted. The output 954 of the DSP 950 is coupled to a first input 972 of an up-conversion stage 970 via a digital-to-analogue converter (DAC) 960. The up-conversion stage 970 up-converts the baseband signal to RF for transmission by mixing the baseband signal with quadrature-related components of the local oscillator signal present at a second input 974 of the up-conversion stage 970. An output 976 of the up-conversion stage 970 is coupled to the antenna 910 via a power amplifier 980 that amplifies the RF signal for transmission. The wireless communication device 900 comprises the oscillator circuit 100 described with reference to FIG. 3, which in this embodiment generates the first oscillating tank voltage $V_{T1}$ at the first tank output 13. The first tank output 13 of the oscillator circuit 100 is coupled to an input 992 of a quadrature generation phase element 990. The quadrature phase generation element 990 generates from the first oscillating tank voltage $V_{T1}$ quadrature-related components of the local oscillator signal at a first output 994 and at a second output 996 of the quadrature phase generation element 990. The first output 994 of the quadrature phase generation element 990 is coupled to the second input 934 of the down-conversion stage 930, and the second output 996 of the quadrature phase generation element 990 is coupled to the second input 974 of the up-conversion stage 970. In applications where the local oscillator signal is required to be a balanced signal, the oscillator circuit 100 may employ any of the embodiments that generate a balanced oscillating signal, in particular the oscillator circuits 115, 140, 150, 160 described with reference to FIGS. 10, 13, 14 and 15.

In a variant of the wireless communication device 900, the oscillator circuit 100 and the quadrature phase generation element 990 may be replaced by one of the oscillator circuits 120, 130, 170, 180 described with reference to FIGS. 11, 12, 16 and 17 which generate quadrature-related oscillating signals or quadrature-related balanced oscillating signals.

Other variations and modifications will be apparent to the skilled person. Such variations and modifications may involve equivalent and other features that are already known and which may be used instead of, or in addition to, features described herein. Features that are described in the context of separate embodiments may be provided in combination in a single embodiment. Conversely, features that are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that where a component is described as being "arranged to" or "adapted to" perform a particular function, it may be appropriate to consider the component as merely suitable "for" performing the function, depending on the context in which the component is being considered. Throughout the text, these terms are generally considered as interchangeable, unless the particular context dictates otherwise. It should also be noted that the Figures are not necessarily to scale; emphasis instead generally being placed upon illustrating the principles of the present invention.

The invention claimed is:

1. An oscillator circuit comprising:
a first tank circuit comprising an inductive element and a capacitive element coupled in series between a voltage rail and a first drive node; and
a feedback stage coupled to a first tank output of the first tank circuit and to the first drive node;
wherein the feedback stage is arranged to generate, responsive to a first oscillating tank voltage present at the first tank output, a first oscillating drive voltage at the first drive node in-phase with an oscillating tank current flowing in the inductive element and the capacitive element, thereby causing the oscillator circuit to oscillate in a series resonance mode of the inductive element and the capacitive element.

2. The oscillator circuit as claimed in claim 1, wherein the feedback stage is arranged to generate the first oscillating drive voltage having a substantially rectangular waveform.

3. The oscillator circuit as claimed in claim 1, wherein the first tank circuit is arranged to generate, responsive to the first oscillating drive voltage, the first oscillating tank voltage in-phase with the first oscillating drive voltage, and wherein the feedback stage comprises a first driver arranged to generate, responsive to the first oscillating tank voltage, the first oscillating drive voltage in-phase with the first oscillating tank voltage.

4. The oscillator circuit as claimed in claim 1, wherein the first tank circuit is arranged to generate, responsive to the first oscillating drive voltage, the first oscillating tank voltage one hundred and eighty degrees out-of-phase with the first oscillating drive voltage, and wherein the feedback stage comprises a first driver arranged to generate, responsive to the first oscillating tank voltage, the first oscillating drive voltage one hundred and eighty degrees out-of-phase with the first oscillating tank voltage by applying signal inversion to the first oscillating tank voltage.

5. The oscillator circuit as claimed in claim 1, wherein the first tank circuit is arranged to generate, responsive to the first oscillating drive voltage, the first oscillating tank voltage in-phase with the first oscillating drive voltage, and wherein the feedback stage comprises:
a second driver arranged to generate a second oscillating drive voltage by applying signal inversion to the first oscillating tank voltage;
a second tank circuit arranged to generate, responsive to the second oscillating drive voltage, a second oscillating tank voltage in-phase with the second oscillating drive voltage; and
a first driver arranged to generate the first oscillating drive voltage by applying signal inversion to the second oscillating tank voltage.

6. The oscillator circuit as claimed in claim 1, wherein the first tank circuit is arranged to generate, responsive to the first oscillating drive voltage, the first oscillating tank voltage one hundred and eighty degrees out-of-phase with the first oscillating drive voltage, and wherein the feedback stage comprises:
a second driver arranged to generate a second oscillating drive voltage by applying signal inversion to the first oscillating tank voltage;
a second tank circuit arranged to generate, responsive to the second oscillating drive voltage, a second oscillating tank voltage in-phase with the second oscillating drive voltage; and
a first driver arranged to generate the first oscillating drive voltage in-phase with the second oscillating tank voltage.

7. The oscillator circuit as claimed in claim 1, wherein the first tank circuit is arranged to generate, responsive to the first oscillating drive voltage, the first oscillating tank voltage one hundred and eighty degrees out-of-phase with the first oscillating drive voltage, and wherein the feedback stage comprises:
a second driver arranged to generate, responsive to the first oscillating tank voltage, a second oscillating drive voltage in-phase with the first oscillating tank voltage;
a second tank circuit arranged to generate, responsive to the second oscillating drive voltage, a second oscillating tank voltage one hundred and eighty degrees out-of-phase with the second oscillating drive voltage; and
a first driver arranged to generate, responsive to the second oscillating tank voltage, the first oscillating drive voltage in-phase with the second oscillating tank voltage.

8. The oscillator circuit as claimed in claim 3, wherein the first tank circuit comprises a sensor device arranged to generate the first oscillating tank voltage responsive to the first oscillating tank current.

9. The oscillator circuit as claimed in claim 8, wherein the sensor device comprises one of a resistive element and a transformer coupled in series with the inductive element and the capacitive element between the voltage rail and the first drive node.

10. The oscillator circuit as claimed in claim 8, wherein the sensor device is magnetically coupled to the inductive element for generating by magnetic induction the first oscillating tank voltage responsive to the first oscillating tank current.

11. The oscillator circuit as claimed in claim 1, wherein the first tank circuit is arranged to generate, responsive to the first oscillating drive voltage, the first oscillating tank voltage having a phase lagging by ninety degrees a phase of the first oscillating drive voltage, and wherein the feedback stage comprises a phase shifting stage arranged to generate a first intermediate oscillating voltage by applying a phase lag of ninety degrees to the first oscillating tank voltage and the oscillator circuit further comprises a first driver arranged to generate the first oscillating drive voltage by applying signal inversion to the first intermediate oscillating voltage.

12. The oscillator circuit as claimed in claim 1, wherein the first tank circuit is arranged to generate, responsive to the first oscillating drive voltage, the first oscillating tank voltage having a phase leading by ninety degrees a phase of the first oscillating drive voltage, and wherein the feedback stage comprises a phase shifting stage arranged to generate a first intermediate oscillating voltage by applying a phase lag of ninety degrees to the first oscillating tank voltage, further comprising a first driver arranged to generate the first oscillating drive voltage in response to, and in-phase with, the first intermediate oscillating voltage.

13. The oscillator circuit as claimed in claim 1, wherein the first tank circuit is arranged to generate, responsive to the first oscillating drive voltage, the first oscillating tank voltage having a phase lagging by ninety degrees a phase of the first oscillating drive voltage, and wherein the feedback stage comprises:
- a first phase shift circuit arranged to generate a first intermediate oscillating voltage by applying a phase lag of ninety degrees to the first oscillating tank voltage;
- a second driver arranged to generate, responsive to the first intermediate oscillating voltage, a second oscillating drive voltage in-phase with the first intermediate oscillating voltage,
- a second tank circuit arranged to generate, responsive to the second oscillating drive voltage, a second oscillating tank voltage having a phase lagging by ninety degrees a phase of the second oscillating drive voltage;
- a second phase shift circuit arranged to generate a second intermediate oscillating voltage by applying a phase lag of ninety degrees to the second oscillating tank voltage; and
- a first driver arranged to generate, responsive to the second intermediate oscillating voltage, the first oscillating drive voltage in-phase with the second intermediate oscillating voltage.

14. The oscillator circuit as claimed in claim 1, wherein the first tank circuit is arranged to generate, responsive to the first oscillating drive voltage, the first oscillating tank voltage having a phase lagging by ninety degrees a phase of the first oscillating drive voltage, and wherein the feedback stage comprises:
- a first phase shift circuit arranged to generate a first intermediate oscillating voltage by applying a phase lag of ninety degrees to the first oscillating tank voltage;
- a second driver arranged to generate a second oscillating drive voltage by applying signal inversion to the first intermediate oscillating voltage;
- a second tank circuit arranged to generate, responsive to the second oscillating drive voltage, a second oscillating tank voltage having a phase leading by ninety degrees a phase of the second oscillating drive voltage;
- a second phase shift circuit arranged to generate a second intermediate oscillating voltage by applying a phase lag of ninety degrees to the second oscillating tank voltage; and
- a first driver arranged to generate, responsive to the second intermediate oscillating voltage, the first oscillating drive voltage in-phase with the second intermediate oscillating voltage.

15. The oscillator circuit as claimed in claim 1, wherein the first tank circuit is arranged to generate, responsive to the first oscillating drive voltage, the first oscillating tank voltage having a phase lagging by ninety degrees a phase of the first oscillating drive voltage, and wherein the feedback stage comprises:
- a second driver arranged to generate a second oscillating drive voltage by applying signal inversion to the first oscillating tank voltage;
- a second tank circuit arranged to generate, responsive to the second oscillating drive voltage, a second oscillating tank voltage having a phase lagging by ninety degrees a phase of the second oscillating drive voltage; and
- a first driver arranged to generate, responsive to the second oscillating tank voltage, the first oscillating drive voltage in-phase with the second oscillating tank voltage.

16. The oscillator circuit as claimed in claim 1, wherein the first tank circuit is arranged to generate, responsive to the first oscillating drive voltage, the first oscillating tank voltage having a phase leading by ninety degrees a phase of the first oscillating drive voltage, and wherein the feedback stage comprises:
- a second driver arranged to generate a second oscillating drive voltage by applying signal inversion to the first oscillating tank voltage;
- a second tank circuit arranged to generate, responsive to the second oscillating drive voltage, a second oscillating tank voltage having a phase leading by ninety degrees a phase of the second oscillating drive voltage; and
- a first driver arranged to generate, responsive to the second oscillating tank voltage, the first oscillating drive voltage in-phase with the second oscillating tank voltage.

17. The oscillator circuit as claimed in claim 1, wherein the first tank circuit is arranged to generate, responsive to the first oscillating drive voltage, the first oscillating tank voltage having a phase leading by ninety degrees a phase of the first oscillating drive voltage, and wherein the feedback stage comprises:
- a second driver arranged to generate, responsive to the first oscillating tank voltage, a second oscillating drive voltage in-phase with the first oscillating tank voltage;
- a second tank circuit arranged to generate, responsive to the second oscillating drive voltage, a second oscillating tank voltage having a phase lagging by ninety degrees a phase of the second oscillating drive voltage; and
- a first driver arranged to generate, responsive to the second oscillating tank voltage, the first oscillating drive voltage in-phase with the second oscillating tank voltage.

18. The oscillator circuit as claimed in claim 1, wherein the first tank circuit is arranged to generate, responsive to the first oscillating drive voltage, the first oscillating tank voltage having a phase lagging by ninety degrees a phase of the first oscillating drive voltage, and wherein the feedback stage comprises:
- a second driver arranged to generate, responsive to the first oscillating tank voltage, a second oscillating drive voltage in-phase with the first oscillating tank voltage;
- a second tank circuit arranged to generate, responsive to the second oscillating drive voltage, a second oscillating tank voltage having a phase lagging by ninety degrees a phase of the second oscillating drive voltage;
- a third driver arranged to generate, responsive to the second oscillating tank voltage, a third oscillating drive voltage in-phase with the second oscillating tank voltage;
- a third tank circuit arranged to generate, responsive to the third oscillating drive voltage, a third oscillating tank voltage having a phase lagging by ninety degrees a phase of the third oscillating drive voltage;
a fourth driver arranged to generate, responsive to the third oscillating tank voltage, a fourth oscillating drive voltage in-phase with the third oscillating tank voltage;
a fourth tank circuit arranged to generate, responsive to the fourth oscillating drive voltage, a fourth oscillating tank voltage having a phase lagging by ninety degrees a phase of the fourth oscillating drive voltage; and
a first driver arranged to generate, responsive to the fourth oscillating tank voltage, the first oscillating drive voltage in-phase with the fourth oscillating tank voltage.

19. The oscillator circuit as claimed in claim 1, wherein the first tank circuit is arranged to generate, responsive to the first oscillating drive voltage, the first oscillating tank voltage having a phase leading by ninety degrees a phase of the first oscillating drive voltage, and wherein the feedback stage comprises:
  a second driver arranged to generate, responsive to the first oscillating tank voltage, a second oscillating drive voltage in-phase with the first oscillating tank voltage;
  a second tank circuit arranged to generate, responsive to the second oscillating drive voltage, a second oscillating tank voltage having a phase leading by ninety degrees a phase of the second oscillating drive voltage;
  a third driver arranged to generate, responsive to the second oscillating tank voltage, a third oscillating drive voltage in-phase with the second oscillating tank voltage;
  a third tank circuit arranged to generate, responsive to the third oscillating drive voltage, a third oscillating tank voltage having a phase leading by ninety degrees a phase of the third oscillating drive voltage;
  a fourth driver arranged to generate, responsive to the third oscillating tank voltage, a fourth oscillating drive voltage in-phase with the third oscillating tank voltage;
  a fourth tank circuit arranged to generate, responsive to the fourth oscillating drive voltage, a fourth oscillating tank voltage having a phase leading by ninety degrees a phase of the fourth oscillating drive voltage; and
  a first driver arranged to generate, responsive to the fourth oscillating tank voltage, the first oscillating drive voltage in-phase with the fourth oscillating tank voltage.

20. The oscillator circuit as claimed in claim 1, wherein the first tank circuit is arranged to generate, responsive to the first oscillating drive voltage, the first oscillating tank voltage having a phase lagging by ninety degrees a phase of the first oscillating drive voltage, and wherein the feedback stage comprises:
  a second driver arranged to generate a second oscillating drive voltage by applying signal inversion to the first oscillating tank voltage;
  a second tank circuit arranged to generate, responsive to the second oscillating drive voltage, a second oscillating tank voltage having a phase lagging by ninety degrees a phase of the second oscillating drive voltage;
  a third driver arranged to generate a third oscillating drive voltage by applying signal inversion to the second oscillating tank voltage;
  a third tank circuit arranged to generate, responsive to the third oscillating drive voltage, a third oscillating tank voltage having a phase lagging by ninety degrees a phase of the third oscillating drive voltage;
  a fourth driver arranged to generate a fourth oscillating drive voltage by applying signal inversion to the third oscillating tank voltage;
  a fourth tank circuit arranged to generate, responsive to the fourth oscillating drive voltage, a fourth oscillating tank voltage having a phase lagging by ninety degrees a phase of the fourth oscillating drive voltage; and
  a first driver arranged to generate the first oscillating drive voltage by applying signal inversion to the fourth oscillating tank voltage.

21. The oscillator circuit as claimed in claim 1, wherein the first tank circuit is arranged to generate, responsive to the first oscillating drive voltage, the first oscillating tank voltage having a phase leading by ninety degrees a phase of the first oscillating drive voltage, and wherein the feedback stage comprises:
  a second driver arranged to generate a second oscillating drive voltage by applying signal inversion to the first oscillating tank voltage;
  a second tank circuit arranged to generate, responsive to the second oscillating drive voltage, a second oscillating tank voltage having a phase leading by ninety degrees a phase of the second oscillating drive voltage;
  a third driver arranged to generate a third oscillating drive voltage by applying signal inversion to the second oscillating tank voltage;
  a third tank circuit arranged to generate, responsive to the third oscillating drive voltage, a third oscillating tank voltage having a phase leading by ninety degrees a phase of the third oscillating drive voltage;
  a fourth driver arranged to generate a fourth oscillating drive voltage by applying signal inversion to the third oscillating tank voltage;
  a fourth tank circuit arranged to generate, responsive to the fourth oscillating drive voltage, a fourth oscillating tank voltage having a phase leading by ninety degrees a phase of the fourth oscillating drive voltage; and
  a first driver arranged to generate the first oscillating drive voltage by applying signal inversion to the fourth oscillating tank voltage.

22. The oscillator circuit as claimed in claim 8, wherein the capacitive element is coupled between the first drive node and the first tank output and the inductive element is coupled between the first tank output and the first voltage rail.

23. The oscillator circuit as claimed in claim 8 wherein the inductive element is coupled between the first drive node and the first tank output and the capacitive element is coupled between the first tank output and the first voltage rail.

24. A wireless communication device comprising:
  an oscillator circuit comprising:
    a first tank circuit comprising an inductive element and a capacitive element coupled in series between a voltage rail and a first drive node; and
    a feedback stage coupled to a first tank output of the first tank circuit and to the first drive node;
    wherein the feedback stage is arranged to generate, responsive to a first oscillating tank voltage present at the first tank output, a first oscillating drive voltage at the first drive node in-phase with an oscillating tank current flowing in the inductive element and the capacitive element, thereby causing the oscillator circuit to oscillate in a series resonance mode of the inductive element and the capacitive element.

25. A method of operating an oscillator circuit, the oscillator circuit comprising a first tank circuit comprising an inductive element and a capacitive element coupled in series between a first voltage rail and a first drive node, the method comprising generating, responsive to a first oscillating tank voltage present at a first tank output, a first oscillating drive voltage at the first drive node, wherein the first oscillating drive voltage is in-phase with a first oscillating tank current flowing in the inductive element and the capacitive element, thereby causing the oscillator to oscillate in a series resonance mode of the inductive element and the capacitive element.

26. The oscillator circuit as claimed in claim 3, wherein the feedback stage includes a feedback stage tank circuit and the first driver comprises:
   an input coupled to the feedback stage tank circuit;
   an output coupled with the first drive node;
   a transistor having a gate, a source, and a drain, wherein the source is coupled with the output and the drain is coupled with a power supply rail; and
   a coupling capacitor coupled with the input and the gate.

27. The oscillator circuit as claimed in claim 4, wherein the feedback stage comprises:
   a feedback stage tank circuit having feedback stage tank circuit output, the feedback stage tank circuit coupled with the first driver; and
   a variable capacitance element coupled with the first tank output and the feedback stage tank circuit output.

28. The oscillator circuit as claimed in claim 27, where wherein the feedback stage further comprises:
   a first capacitor coupled between the feedback stage tank circuit output and the variable capacitance element; and
   a second capacitor coupled between the variable capacitance element and the first tank output.

* * * * *

UNITED STATES PATENT AND TRADEMARK OFFICE
CERTIFICATE OF CORRECTION

PATENT NO. : 9,755,627 B2
APPLICATION NO. : 14/417040
DATED : September 5, 2017
INVENTOR(S) : Andreani et al.

Page 1 of 1

It is certified that error appears in the above-identified patent and that said Letters Patent is hereby corrected as shown below:

In the Drawings

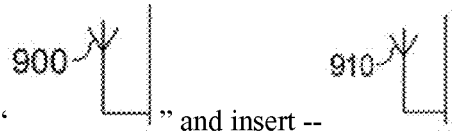

In Fig. 22, Sheet 12 of 12, delete " " and insert --         --, therefor.

In the Specification

In Column 17, Line 29, delete "X." and insert -- $X_S$. --, therefor.

In Column 17, Line 35, delete "X." and insert -- $X_S$. --, therefor.

In Column 26, Lines 47-48, delete "second power supply rail 72," and insert -- second power supply rail 71, --, therefor.

In Column 26, Line 63, delete "$C_{b1}$," and insert -- $C_{b2}$, --, therefor.

In Column 28, Line 41, delete "quadrature generation phase" and insert -- quadrature phase generation --, therefor.

In the Claims

In Column 31, Line 25, in Claim 13, delete "voltage," and insert -- voltage; --, therefor.

In Column 34, Line 43, in Claim 23, delete "claim 8" and insert -- claim 8, --, therefor.

In Column 35, Lines 24-25, in Claim 28, delete "where wherein" and insert -- wherein --, therefor.

Signed and Sealed this
Fifth Day of December, 2017

Joseph Matal
*Performing the Functions and Duties of the
Under Secretary of Commerce for Intellectual Property and
Director of the United States Patent and Trademark Office*